United States Patent
Jackson et al.

(10) Patent No.: US 10,670,492 B2
(45) Date of Patent: Jun. 2, 2020

(54) LEAK DETECTION AND LOCATION SYSTEM AND METHOD

(71) Applicant: Smart Leak Solution (SLS) Limited, Dublin (IE)

(72) Inventors: Diarmuid Jackson, Bray (IE); Maurice Deasy, Roscrea (IE)

(73) Assignee: Smart Leak Solution (SLS) Limited, Dublin (IE)

( * ) Notice: Subject to any disclaimer, the term of this patent is extended or adjusted under 35 U.S.C. 154(b) by 53 days.

(21) Appl. No.: 16/137,873

(22) Filed: Sep. 21, 2018

(65) Prior Publication Data
US 2019/0094103 A1   Mar. 28, 2019

(30) Foreign Application Priority Data

Sep. 27, 2017  (EP) .................................... 17193605

(51) Int. Cl.
  *G01M 3/40*  (2006.01)
  *G01N 27/22*  (2006.01)
  (Continued)

(52) U.S. Cl.
  CPC .............. *G01M 3/40* (2013.01); *G01M 3/165* (2013.01); *G01N 27/223* (2013.01);
  (Continued)

(58) Field of Classification Search
  CPC ........ G01R 27/00; G01R 27/02; G01R 27/22; G01R 27/226; G01R 27/26; G01R 27/2605; G01R 1/00; G01R 1/02; G01R 1/06; G01R 1/067; G01R 1/06794; G01M 3/00; G01M 3/02; G01M 3/04; G01M 3/16; G01M 3/165; G01M 3/40; G01N 27/00;
  (Continued)

(56) References Cited

U.S. PATENT DOCUMENTS

| 3,789,297 | A | * | 1/1974 | Frolich | ................. | G01M 3/184 |
| | | | | | | 324/694 |
| 4,031,742 | A | * | 6/1977 | Michael | .................. | G01M 3/16 |
| | | | | | | 73/40.7 |
| 5,081,422 | A | | 1/1992 | Shih | | |
| 5,381,097 | A | * | 1/1995 | Takatori | ................ | G01M 3/045 |
| | | | | | | 174/47 |

(Continued)

OTHER PUBLICATIONS

Extended European Search Report for European Patent Application No. 17193605.7, dated Apr. 16, 2018, 7 pages.

*Primary Examiner* — Hoai-An D. Nguyen
(74) *Attorney, Agent, or Firm* — Withrow & Terranova, P.L.L.C.

(57) ABSTRACT

A system for locating a leak in a building layer comprises a sensing module comprising a cell having a major surface juxtaposed a first surface of the building layer and incorporating mutually spaced electrodes defining a sensing path extending parallel to the cell major surface. Sensing circuitry cooperates with the cell and applies a voltage between the cell electrodes to measure an electrical property. A probe is applied to a second surface of the building layer opposite the first surface and applies a voltage between at least one of the cell electrodes and the probe to measure an electrical property. Control circuitry detects the presence of a leak within the portion of the first surface based on a first measurement; and locates a point of leakage based on a second measurement from the sensing circuitry of the electrical property between the probe and the cell electrodes.

15 Claims, 22 Drawing Sheets

(51) Int. Cl.
*G01R 1/067* (2006.01)
*G01R 27/26* (2006.01)
*H03M 1/12* (2006.01)
*G01M 3/16* (2006.01)

(52) U.S. Cl.
CPC ......... *G01N 27/226* (2013.01); *G01N 27/228* (2013.01); *G01R 1/06794* (2013.01); *G01R 27/2605* (2013.01); *H03M 1/1205* (2013.01)

(58) Field of Classification Search
CPC ...... G01N 27/02; G01N 27/22; G01N 27/223; G01N 27/226; G01N 27/228; H03M 1/00; H03M 1/12; H03M 1/1205
USPC ....... 324/500, 512, 519, 600, 602, 605, 606, 324/629, 647, 649, 658, 663, 664, 665, 324/672, 679, 693, 694, 713, 715, 718, 324/555, 71.1; 73/37, 40; 340/605
See application file for complete search history.

(56) References Cited

U.S. PATENT DOCUMENTS

| | | | | |
|---|---|---|---|---|
| 5,517,181 | A * | 5/1996 | Gray | G01N 27/06 204/416 |
| 5,540,085 | A | 7/1996 | Sakata et al. | |
| 7,554,345 | B2 * | 6/2009 | Vokey | G01M 3/16 324/522 |
| 8,319,508 | B2 * | 11/2012 | Vokey | C23F 13/02 324/522 |
| 2005/0162280 | A1 * | 7/2005 | Hayashida | G01M 3/16 340/605 |
| 2010/0073012 | A1 * | 3/2010 | Inoue | H02K 9/24 324/551 |
| 2013/0231620 | A1 * | 9/2013 | Thirstrup | A61F 5/445 604/344 |
| 2015/0084614 | A1 * | 3/2015 | Alatainio | G01M 3/16 324/71.1 |
| 2016/0166757 | A1 * | 6/2016 | Koyama | G01M 3/16 324/693 |

* cited by examiner

LEAK DETECTION AND LOCATION SYSTEM AND METHOD

This application claims priority to European application number 17193605.7, filed Sep. 27, 2017, the disclosure of which is incorporated herein by reference in its entirety.

FIELD

The present invention relates to a system and method for detecting and locating of a leak in a building layer.

BACKGROUND

In the construction of a building, it is challenging to provide a watertight layer, especially a waterproof flat roof or basement. Many enterprises solely provide either leak prevention or leak repair services.

Currently, it is difficult to determine if a flat roof has been successfully waterproofed until a leak presents itself internally, potentially causing damage. This is also true for roof degradation, where it is not possible to determine if the roof has degraded significantly until a leak presents internally.

The detection and location of a leak within a building is inherently difficult. A major issue with a leak presenting internally is that the source and the scale of the leak is unknown. It is particularly difficult to identify and locate the leak in time to prevent any damage to the internal structure or personal property, as well as the associated additional repair or legal costs.

Where it is not possible to locate a leak accurately, it is often necessary to replace a disproportionately large area of a roof in order to repair what may be a small leak ingress point. This approach has a significant level of risk as there is no guarantee that the area selected covers the leak (or multiple leaks) or that the repaired roof was replaced properly without any new leak points.

For example, devices are currently employed to detect the presence of a fluid due to a leak. However, these devices only detect a leak at a specified point (typically within few square millimeters) and need the fluid to come into direct contact with their sensor, which only covers a small percentage of the monitored area.

SUMMARY

A system and a method for detecting a leak in a building layer are provided according to claims 1 and 15, respectively.

Embodiments of the system and method resolve the issues discussed above, by providing a solution for accurately detecting, locating, and reporting in real time a leak occurring in a building layer.

In particular, the system can operate according to a detection mode and a location mode. In the detection mode, the system is capable of accurately detecting a leak presence within an area of the building layer in the range of one or more $m^2$. This detection can be achieved in real time, so that the leak area can be identified prior to causing damage.

When the area of the leak is identified, the system is capable of more exactly locating the leak ingress point within the identified area, with a spatial resolution of few $mm^2$. In this way, the detection of a small leak ingress point is focused only on a limited already identified area of the building layer, thus avoiding slow and disproportionately large area operations on the building layer.

While being capable of quickly and accurately detecting and locating a leak at any point of the building layer, the system is devised to cover a maximum area of the building layer with a minimum number of components and devices. The system components are thin, easily installed and require little or no maintenance over their lifetime.

Furthermore, the system provides a highly scalable layout to match the requirements of each building.

Preferably, control circuitry comprises at least one sensor array control circuit and at least one sensing module comprises an array of sensing modules operatively connected to the sensor array control circuit.

Preferably, the sensor array control circuit is operatively connected to a daisy chain for signal transmission, and wherein said array of sensing modules comprises at least one row of sensing modules operatively connected to a branch of said daisy chain.

Further preferably, second selecting circuitry is operatively associated to said branch of the daisy chain, said second selecting circuity being configured and controllable to sequentially select the sensing modules within the row for communication with the sensor array control circuit.

The sensor array control circuit can comprise a port for electrical connection with a probe.

A master controller can be configured for monitoring said at least one sensor array control circuit and for communicating with at least one of a database, a user interface and a user application.

In some embodiments, the system is configured to generate and log data indicative of the progression of the detected leak over time.

The control circuitry can be further configured to detect a ceasing of the leak based on further measurements from the sensing circuitry of the electrical property between the cell electrodes, and wherein said system can be configured to:
  trigger the generation of a digital signal when the control circuitry detects the leak presence; and
  stop the digital signal when the leak ceasing is detected.

After the detection of the leak presence, the control circuitry can be configured to collect further measurements from the sensing circuitry of the electrical property between the cell electrodes, and the system can be configured to record said further measurements until the control circuitry detects a leak ceasing based on said further measurements.

In some embodiments, applying a voltage between cell electrodes to measure an electrical property therebetween comprises periodically swapping the polarity of the applied voltage.

In addition or alternatively, applying a voltage between at least one of the cell electrodes and a probe to measure an electrical property therebetween comprises periodically swapping the polarity of the applied voltage.

Some embodiments comprise applying the same voltage to the cell electrodes while measuring the electrical property between the probe and at least one of the cell electrodes.

BRIEF DESCRIPTION OF DRAWINGS

Embodiments of the invention will now be described, by way of example, with reference to the accompanying drawings, in which.

DETAILED DESCRIPTION

Figure 1:
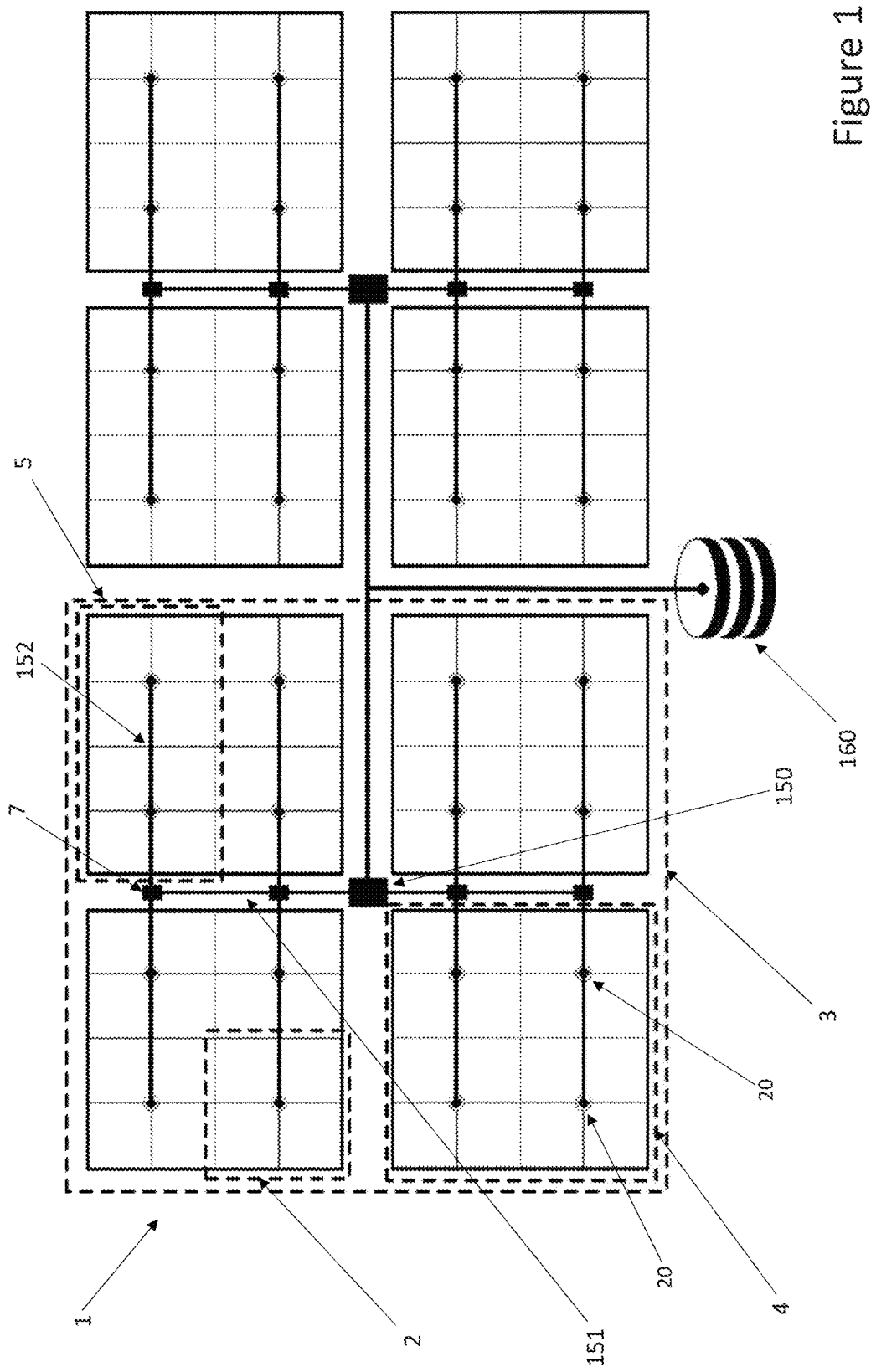
FIG. 1 illustrates the layout of a system portion according to an embodiment of the present invention.

It should be noted that in the detailed description that follows, identical or similar components, either from a structural and/or functional point of view, can have the same reference numerals, regardless of whether they are shown in different embodiments of the present disclosure. It should also be noted that in order to clearly and concisely describe the present invention, the drawings may not necessarily be to scale and certain features of the disclosure may be shown in somewhat schematic form.

With reference to the attached Figures, the present disclosure is related to a system 1 and method 100 for monitoring a smart building capable of accurately detecting and locating a leak in a building layer. Without limitation, the building layer can be for example a roof, a basement, a floor or a ceiling of a building.

FIG. 1 illustrates the basic layout of a system portion. The system 1 comprises a plurality of sensing modules 2 extending across and capable of monitoring corresponding areas of the building layer and providing to associated sensor array control circuits (ACC) 150 measurements for detecting the presence of a leak within the monitored areas of the building layer.

Figure 2:
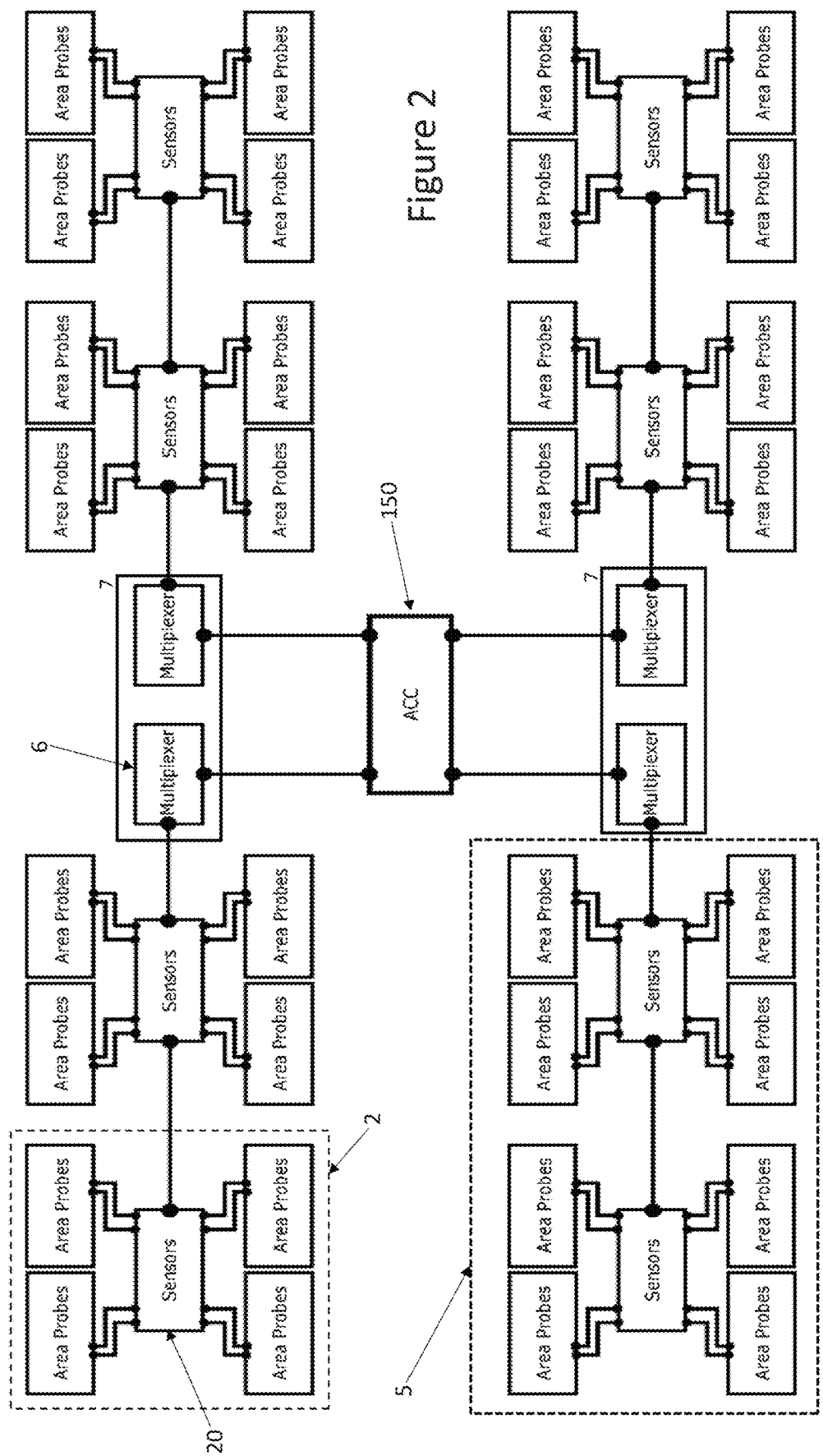
FIG. 2 illustrates a portion of the layout illustrated in FIG. 1.

Referring to FIG. 2, in the embodiment, each sensing module 2 comprises sensor circuitry 20 cooperable with four cells 10. Sensor circuitry 20 can be daisy chained from one sensor module 2 to another and can be connected via a multiplexer 6 (contained within the junction box 7 from FIG. 1) back to the ACC 150. In such implementations, each sensor circuitry has an identifier enabling the sensor circuitry 20 to be selected as required by the ACC 150.

Figure 3:
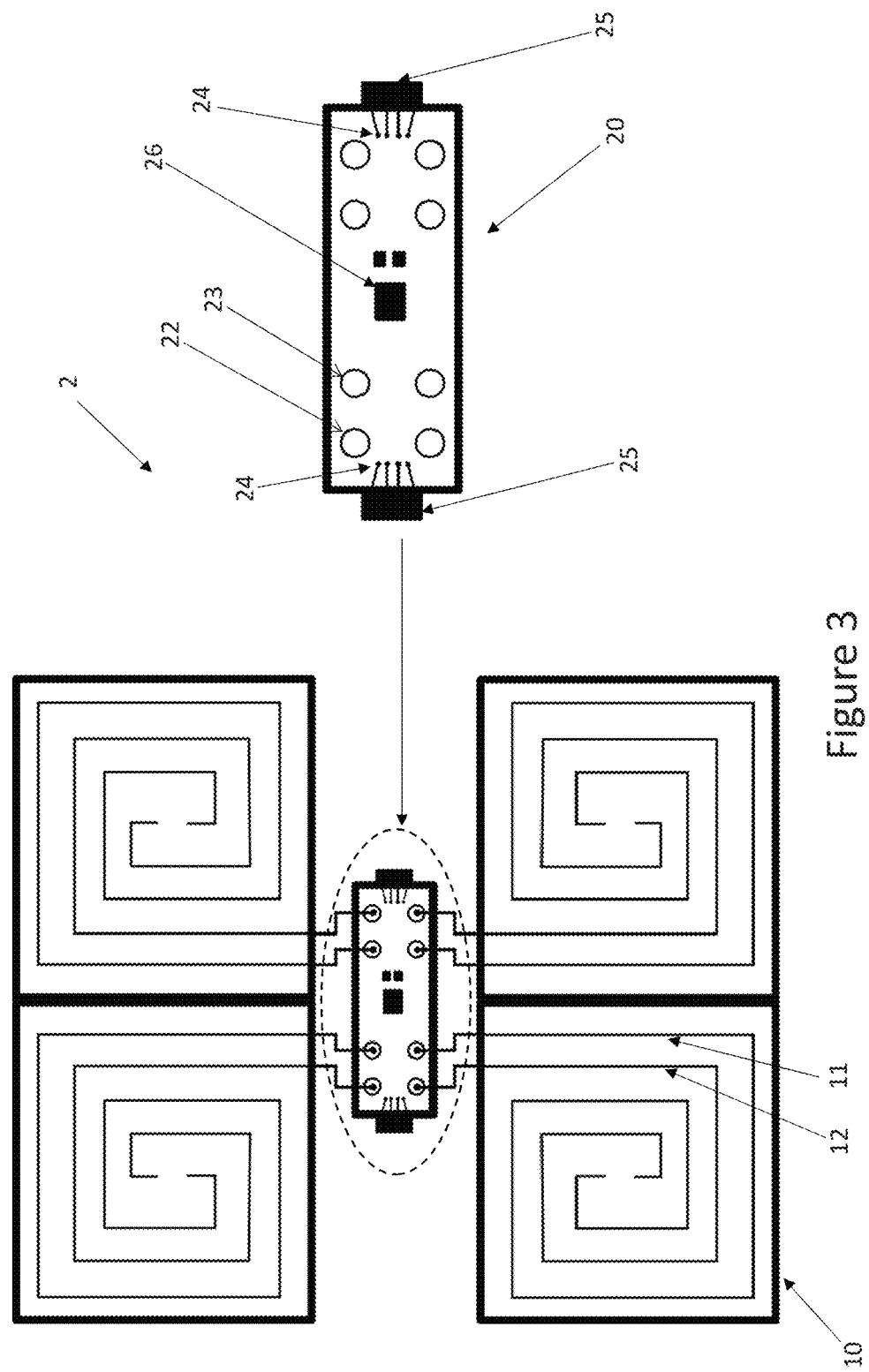
FIG. 3 illustrates a system sensing module.

With reference to FIG. 3, each cell 10 comprises a non-conductive liquid absorbent fabric incorporating a pair of mutually spaced apart electrodes 11, 12 defining respective sensing paths extending parallel to a major surface of the cell 10. In this embodiment, each electrode 11, 12 follows a spiral path with the path of the electrode 12 beginning inside that of the electrode 11, so that these are counterposed along their respective paths. Thus, an open circuit is realized, preventing a charge flowing between the electrodes 11, 12.

Without limitation, the electrodes 11, 12 can be made for example of stainless steel wiring, copper wiring, copper mesh, carbon fibre sheeting/mesh, or Carbon fibre felt.

The electrodes 11, 12 of the cell 10 illustrated in FIG. 3 are arranged adjacently on the same plane, according to a layout solution which presents at least the following advantages: saving of material, cheaper material costs, easy spacing between the electrodes 11, 12, thin cell structure, convenient setup, and adaptability to different needs of a building structure.

Figure 4:
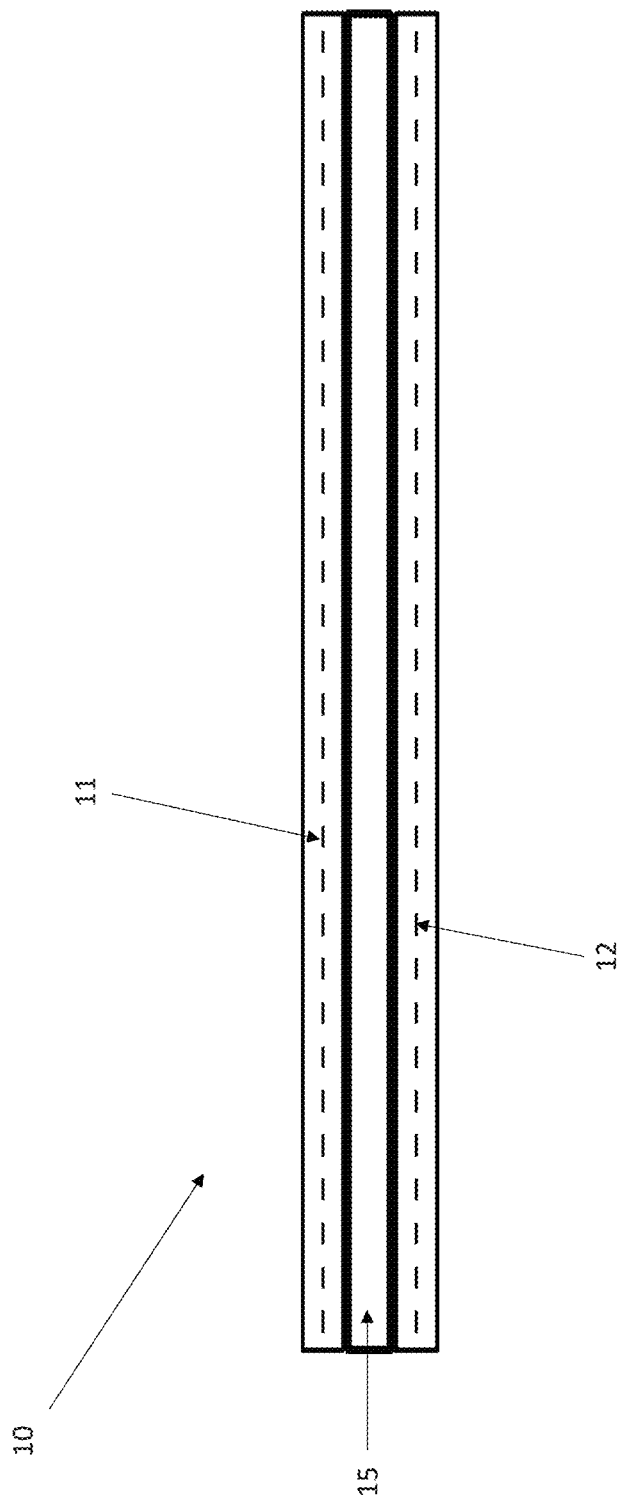
FIG. 4 illustrates a vertical cut-through of a first cell embodiment which can be used in the system.

Alternatively, as shown in FIG. 4, the electrodes 11, 12 can be arranged on two parallel planes separated by a spacing layer 15. Among the advantages of this layout solution are simple manufacturing, improved resiliency, possibility of cutting without losing connection, and closer positioning of the electrodes 11, 12.

Figure 6:
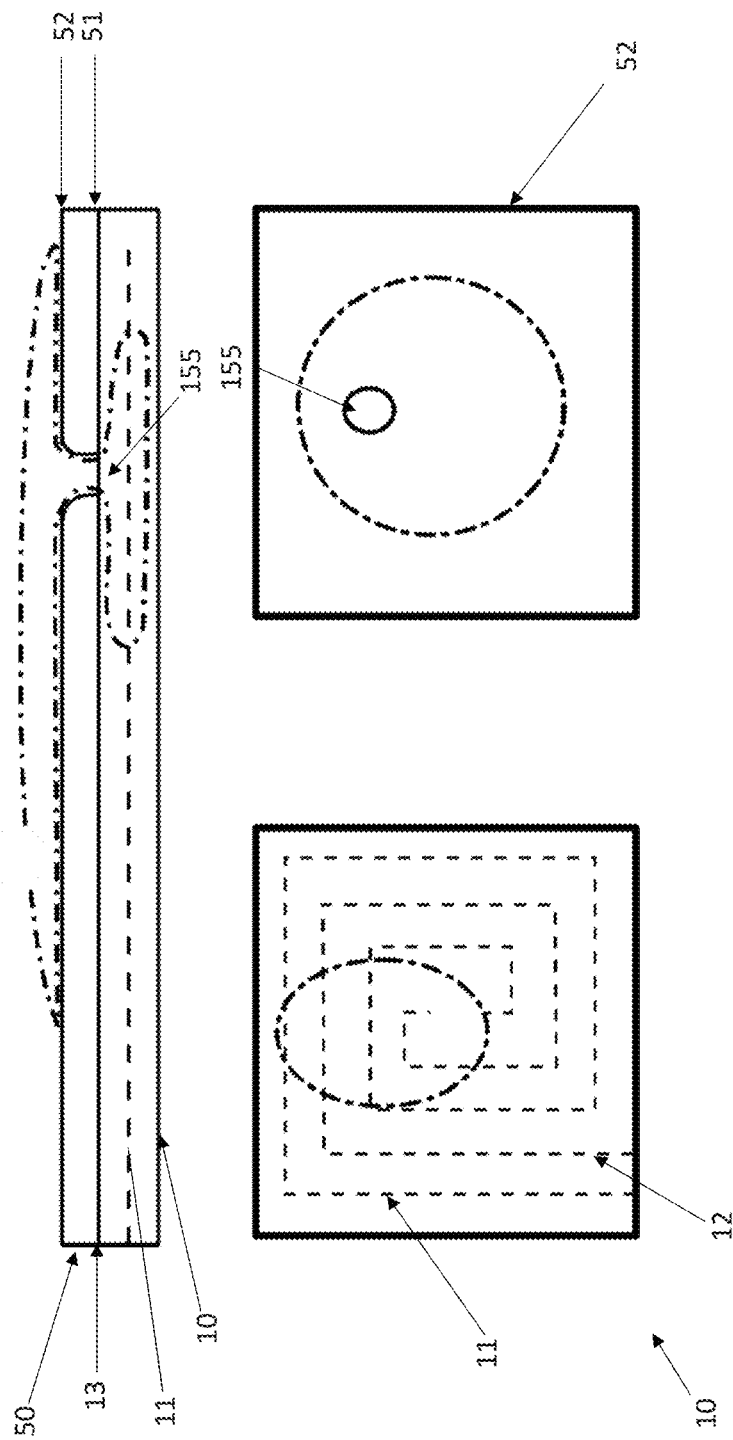
FIG. 6 illustrates a leak through a building layer, leading to an internal presence of fluid at a system cell.

With reference to FIG. 6, each cell 10 is arranged so that its major surface 13 is juxtaposed to a corresponding first surface 51 of a building layer 50.

FIG. 3 illustrates the circuit board of the sensor circuitry 20, comprising respective pairs of connectors 22, 23 for the electrodes 11, 12 of each of the four cells 10, data lines 24, daisy chain connectors 25, and integrated circuits 26. Having a single circuit board for four cells 10 means reducing the number of components on the board by a factor of up to 4.

Nevertheless, it is to be understood that the number of cells 10 cooperable with the same sensor circuitry 20 can be different than four, e.g. two cells 10. Alternatively, the system 1 could comprise sensing modules 2 each having a single cell 10 cooperable with dedicated sensor circuitry 20.

The sensor circuitry 20 is configured to apply a voltage between the electrodes 11, 12 of the four cells 10 and to measure a capacitance therebetween.

With reference to FIG. 6, a liquid can be present at the building surface 51 monitored by one of the cells 10, due to a leak passing through the building layer 50 from the surface 52. This fluid can be absorbed by the fabric of the cell 10, so as to alter the electrical characteristic of the fabric between its electrodes 11, 12. This cause a change in the capacitance between the electrodes 11, 12, which is detectable by the sensing circuitry 20.

Thus, the electrodes 11, 12 allow a leak to be detected within the building layer 50 to a resolution corresponding to the area of one cell 10.

A good compromise between keeping the system 1 practical in view of a leak point detection and location and keeping the number of sensor circuits 20 limited is to choose an area size for each of the four cells 10 in the sensing modules 2 of few m$^2$, preferably 1 or 2 m$^2$.

Figure 5:
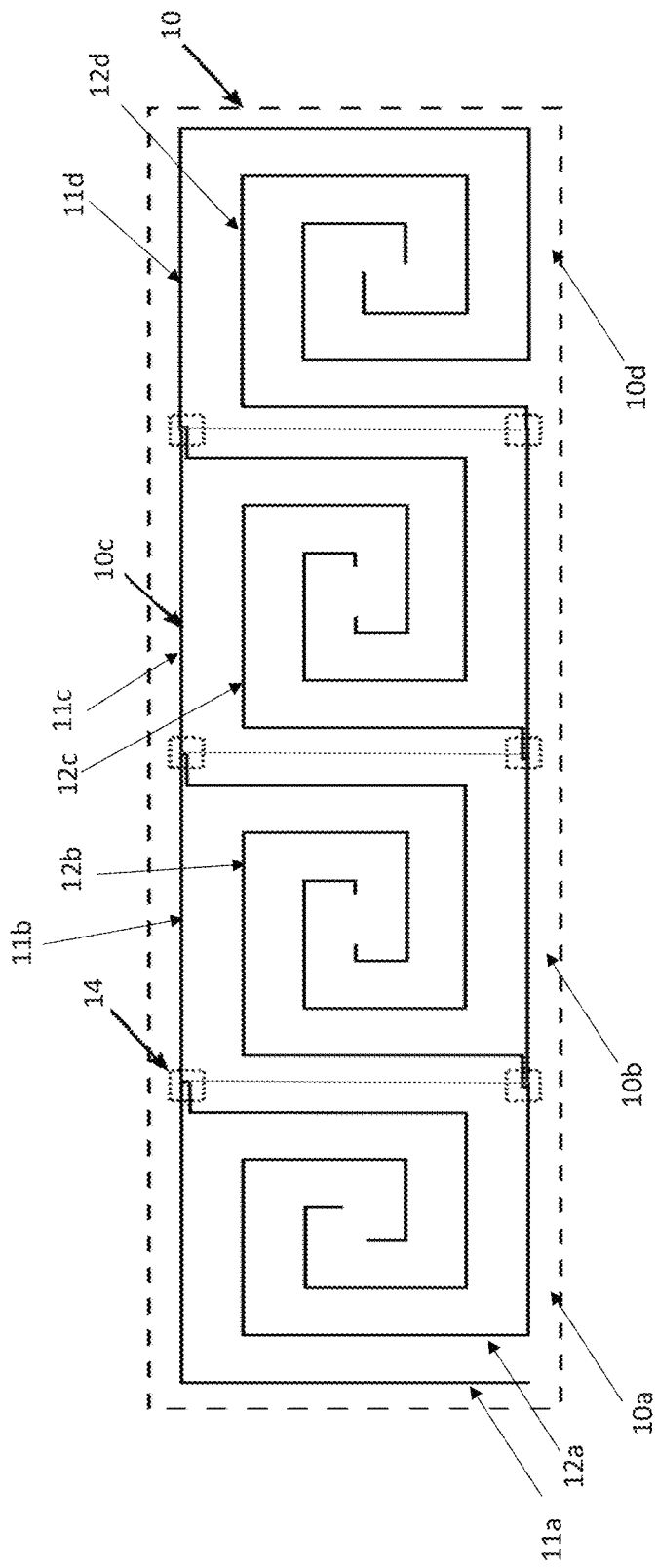
FIG. 5 illustrates a second cell embodiment which can be used in the system.

In case of using sensing modules 2 with only one cell 10 cooperable with one sensor circuitry 20, a cell 10 as illustrated in FIG. 5 can be provided. This cell 10 comprises a plurality of sub-cells 10a-10d, each sub-cell 10a-10d including mutually spaced electrodes 11a-12a, 11b-12b, 11c-12c and 11d-12d defining a sensing sub-path extending parallel to the major surfaces of the sub-cells 10a-10d. The sub-paths are connected to each other at joints 14, so as to define an overall sensing path for the cell 10.

The sub-cells 10a-10d can be dimensioned so that the cell 10 covers an overall area approximately equal to the sum of the areas covered by the four cells 10 of the sensing module 2 illustrated in FIG. 2.

Figure 7:
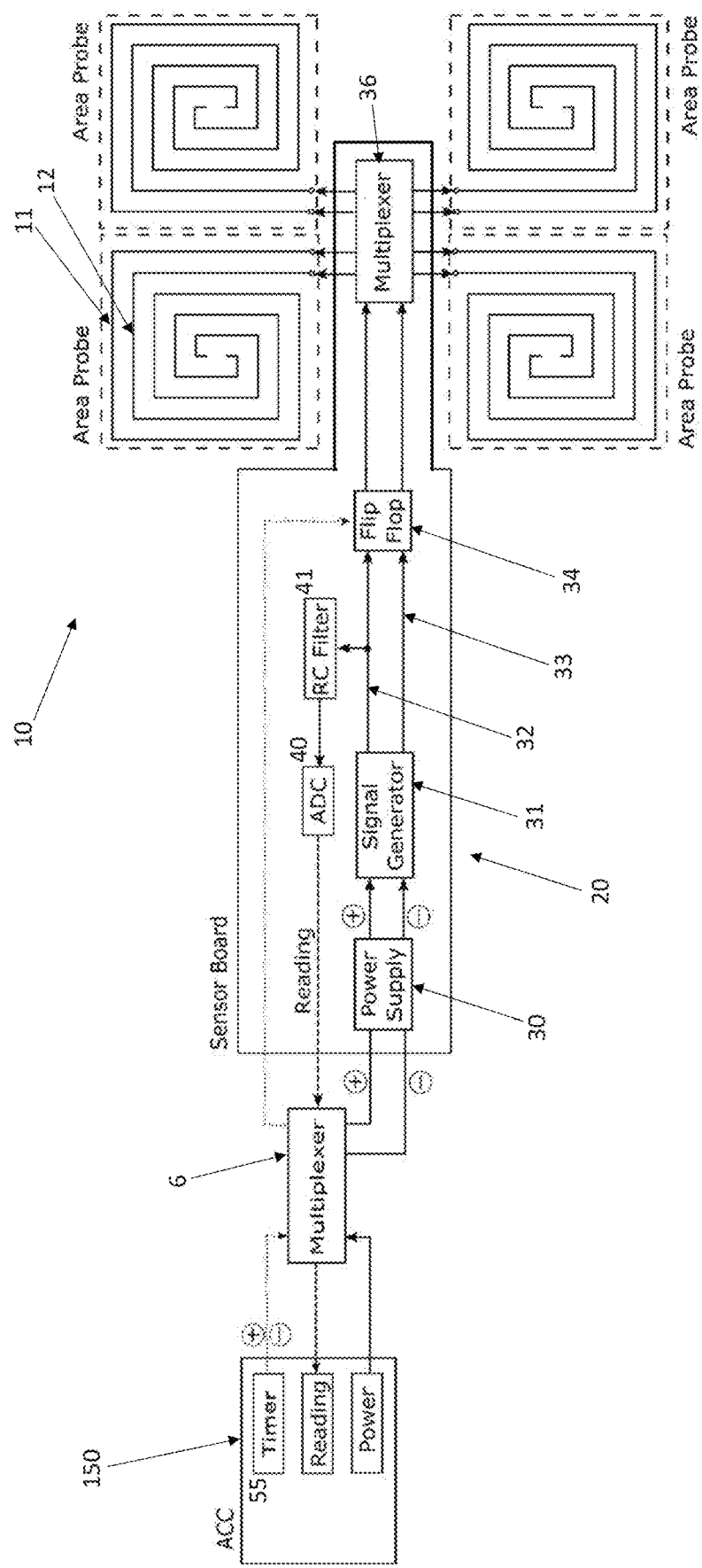
FIG. 7 illustrates the sensing module of FIG. 3, wherein circuit elements of the module are shown operatively connected with a corresponding array control circuit (ACC) and a timer.

With reference now to FIG. 7, there are disclosed the components of the sensing circuitry 20 for measuring a capacitance between the electrodes 11, 12 of the associated four cells 10.

This circuitry 20 comprises a signal generator 31 connected to a power supply 30. The signal generator 31 is configured to generate a voltage between a live line 32 and a line 33 common to the whole system 1 (hereinafter, "common line").

The sensing circuit 20 further comprises a multiplexer 36 configured and controllable to sequentially apply the voltage between the signal and common lines 32, 33 to the four cells 10 of the sensing module 2, so as to sequentially sense the capacitance between the electrodes 11, 12 of these cells 10.

In particular, in order to sense capacitance between the electrodes 11, 12 of each selected cell 10, the signal generator 31 is configured to pulse the voltage of the live line 32.

Preferably, the voltage pulsing occurs within a radio frequency range, e.g. between 30 kHz and 1 MHz. For example, a pulsing frequency of 587 kHz can be set using a Timer IC (555 timer), within the signal generator block 31, set to a 50% duty cycle.

While the voltage generated by the signal generator 31 is applied to the selected cell 10, an analogue voltage signal between its electrodes 11, 12 can be provided to an RC filter 41 for removing high frequency fluctuation components. This signal 38 is indicative of the capacitance of a sensing zone 60 between the electrodes 11, 12.

The filtered signal 38 is then applied to an analogue-to-digital converter 40 (ADC). Notably, only one ADC 40 needs to be used, since the four cells 10 are selected sequentially through the multiplexer 36 for acquiring the capacitance measurements.

Changes in the capacitance measurements acquired from the cells 10 can be used to detect a leak within the corresponding monitored building surfaces 51.

Indeed, with reference to FIG. 6, when a leak reaches the surface 51 monitored by a cell 10, the fluid alters the electrical characteristic of the fabric between its electrodes 11, 12. Thus, more electrons can pass between the electrodes 11, 12, increasing the capacitance of a sensing zone comprising the area of the cell between the electrodes. This capacitance increase causes a decrease in the voltage signal 38 between the electrodes 11, 12 at a given time after the application of a pulse to the cell.

As the quantity of liquid between the electrodes 11, 12 increases, the voltage signal 38 therebetween reduces. Thus, the measured voltage signal 38 is indicative not only of the presence of a leak within the monitored building surface 51, but also of the level of leak.

A capacitance sensing solution as described above is very sensitive to changes in conductivity occurring in the sensing zone 60 between the electrodes 11, 12. Thus, a small amount of liquid between the electrodes 11, 12 can be detected using the measurements outputted by the ADC 40. This also allows for greater spacing between the electrodes 11, 12, resulting in a reduction in material and manufacturing cost.

The sensitivity can be further be improved by swapping the polarity of the voltage applied to the electrodes 11, 12 of the selected cell 10 during the reading of the voltage signal 38.

For this reason, as illustrated in FIG. 7, the sensing circuitry 20 further comprises a flip-flop circuit 34 controllable by a timer 55 to periodically swap the polarity of the voltage between the signal and common lines 32, 33. In the embodiment, the timer 55 is incorporated with the ACC 150 and switched through the multiplexer 6. However, it will be appreciated that the timer 55 could also be implemented on the sensor board 20.

Figure 8:
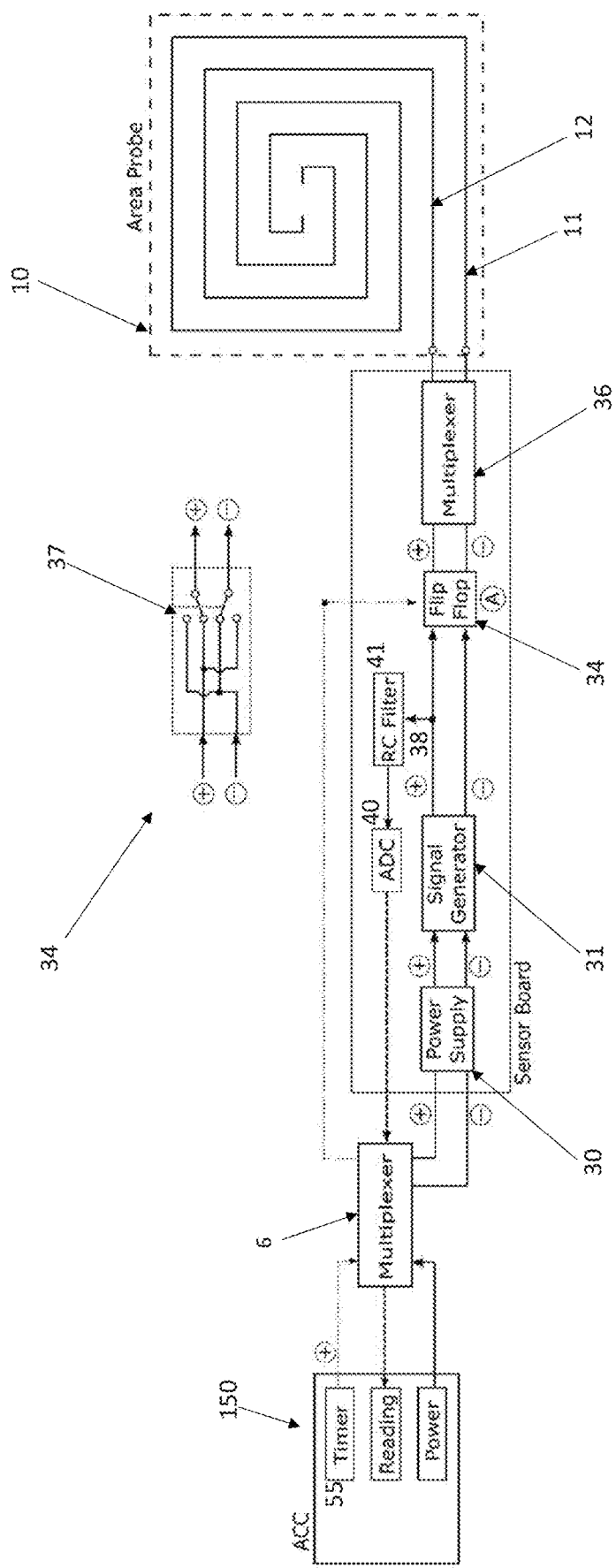
FIGS. 8 and 9 illustrate an operation of the sensing module of FIG. 7 for detecting a leak at a selected cell, wherein the timer provides a positive signal in FIG. 8 and a negative signal in FIG. 9.
Figure 9:
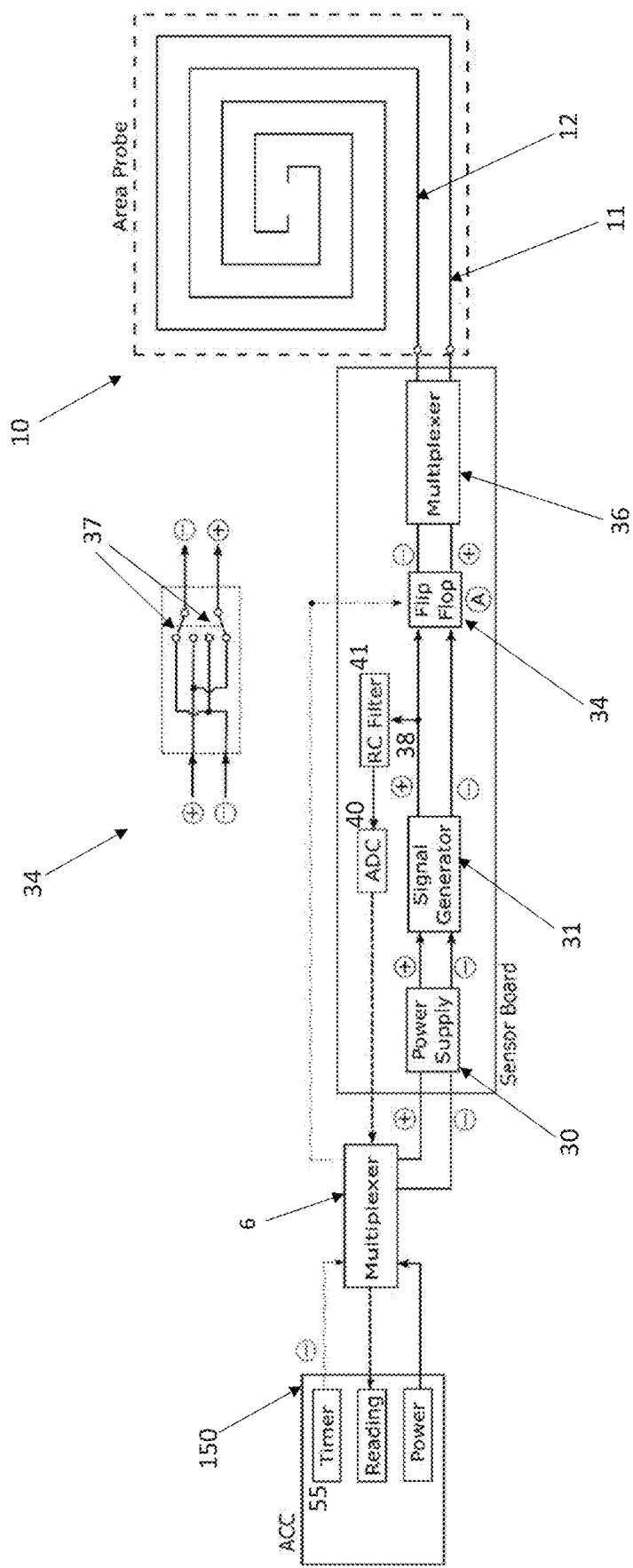
Figure 10:
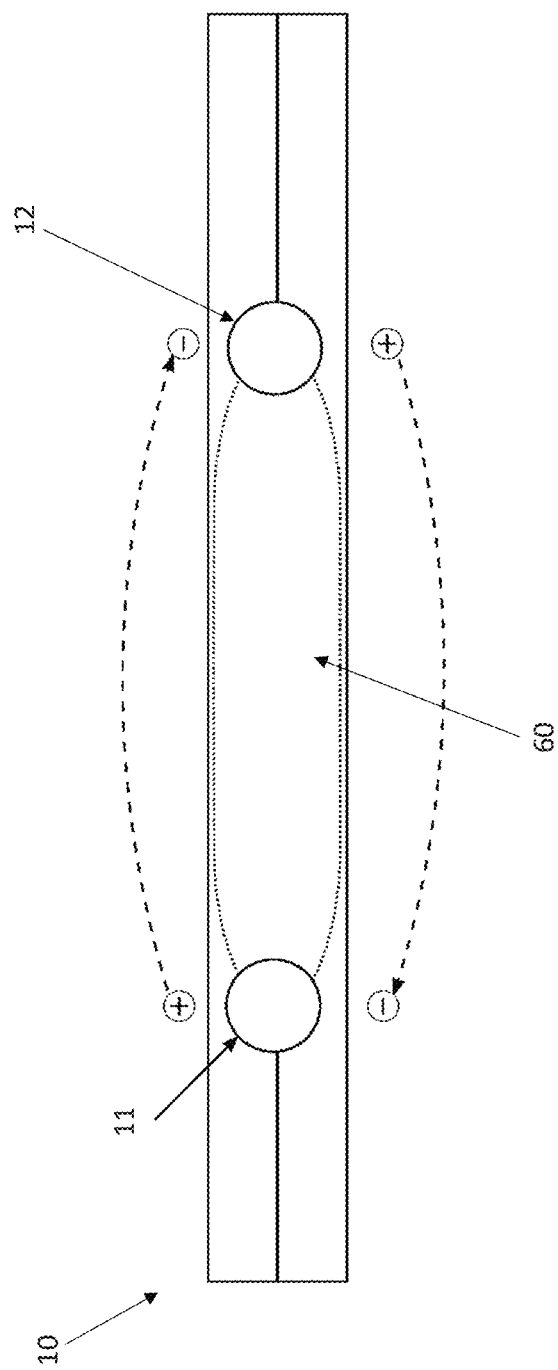
FIG. 10 illustrates a sensing zone within the selected cell illustrated in FIGS. 8 and 9.

FIGS. 8 and 9 illustrate a situation where one cell 10 is selected through the multiplexer 36 for applying a voltage between its electrodes 10, 11. A periodical change in polarity of a timer signal causes a corresponding change in position of flip-flop contacts 37.

Thus, when the timer signal is positive, upper and lower contacts 37 of the flip-flop circuit 34 connects the live line 32 and the common line 33 to the electrode 11 and the electrode 12, respectively, of the selected cell 10. When the timer signal is negative, the upper and lower contacts 37 connect the common line 33 and the live line 32, respectively, to the electrode 11 and the electrode 12.

This solution is based the electrode connected to the live line 32 (anode electrode) being more sensitive to changes in capacitance in the sensing zone 60 than the other electrode connected to the common line 33 (cathode electrode). If a fluid is introduced near or at the anode electrode the detection reading could be up to a factor of ten greater than that of fluid being introduced near or at the cathode electrode.

By using the flip-flop circuit 34, each of the electrodes 11, 12 periodically acts as the anode electrode, thus achieving improved detection sensitivity, better quality readings and a reduction in chances of missing a leak event.

The disclosed components of the sensing circuitry 20 can be realized as different analogue and/or digital electronic modules operatively connected therebetween. Alternatively, a microcontroller can be used to implement at least the power supply 30, the signal generator 31, the flip-flop circuit 34 and the ADC 40. In this case, the microcontroller can use an analogue port to read the voltage signal 38 from the selected cell 10.

While in the above disclosed embodiment the sensor circuitry 20 is configured to measure a capacitance in the sensing zone 60 between the electrodes 11, 12, an alternative solution involves configuring the sensor circuitry 20 to measure an impedance in the sensing zone 60 between the electrodes 11, 12.

This can be done by pulsing the anode electrode with an alternating current and measuring the resultant change in the cathode electrode. The difference between the signals at the electrodes 11, 12 represents the impedance of the sensing zone 60. The presence of liquid within this zone 60 changes the measured impedance which can then be used to detect and subsequently locate a leak.

Alternatively, the sensor circuitry 20 can be configured to measure the resistance between the electrodes 11, 12 of the cells.

With reference again to FIG. 1, there is shown how the sensing modules 2 of the system 1 are operatively associated to the corresponding control circuits 150 for collecting and analyzing the measurements of the capacitance (or another electrical properties) between the electrodes 11, 12 of the cells 10 in order to detect a leak a monitored building surface 51.

In the layout illustrated in FIG. 1 the sensing modules 2 are grouped in sensor arrays 3, wherein the sensing modules 2 of each array 3 are controlled by a corresponding ACC 150.

Each sensor array 3 is subdivided into sensor zones 4. Each sensor zone 4 comprises rows 5 of sensing modules 2 whose sensor circuitries 20 are operatively connected to a corresponding channel of the ACC 150 via a daisy chain 151 for signal transmission. The sensor circuitries 20 of the sensing modules 2 within the same row 5 are end-to-end connected through a branch 152 of the daisy chain 151.

Thus, the building layer 50 being monitored is broken up into areas corresponding to the system zones 4, areas that are sectioned into quadrants corresponding to and monitored by the cells 10 of the sensing modules 2.

In the exemplary embodiment illustrated in FIG. 1, each ACC 150 comprises four channels associated with four sensor zones 4, each zone 4 comprising two rows 5 of two sensing modules 2. The ACC 150 is centrally located between the four sensor zones 4.

However, it has to be understood that the number of channels and associated zones 4, the number of rows 5, and the number of sensing modules 2 within the rows 5 can be different than illustrated in FIG. 1. For example, each channel of the ACC 150 can support up to one or more hundreds of sensing modules 2 divided in rows 5.

Thus, the number of sensing modules 2 within a sensor zone 3 can be configured to cover a large area for leak detection, from less than 1 m² to over one or more hundreds of m², depending on the building layer 50 to be covered.

Preferably, as illustrated in FIG. 1, the branches 152 of the daisy chain 151 lead back to junction boxes 7, which can link directly or through other junction boxes to the ACC 150. This provides versatility in the layout of the sensor arrays 3. Furthermore, the branches 152 of the daisy chain can lead back to repeaters (not shown) for improving signal transmission with the ACC 150.

Since the sensing modules 2 comprise only one sensor circuitry 20 cooperable with four cells 10, rather than four separated sensor circuits 20, the number of connections required and the demand of the system 1 is significantly reduced.

A leak detection operation mode of the system 1 is now disclosed, where each ACC 150 is configured to sequentially collect the capacitance measurements from the sensor circuits 20 of the associated sensor array 3.

In particular, the ACC 150 is configured to read sequentially its channels, each one associated to a corresponding sensor zone 4.

With reference to FIG. 2, as mentioned above, the system 1 further comprises multiplexers 6 operatively associated to the daisy chain branches 152. By means of these multiplexers 6, the ACC 150 can sequentially select the sensing modules 2 within a given sensor row 5, for establishing a communication to their sensor circuitry 20 via the daisy chain 151.

With reference again to FIGS. 7-9, when the ACC 150 has accessed the sensor circuitry 20 of one of the sensing modules 2 within a row 5, the ACC 150 activates the power supply 30 of the sensing circuitry 21 for generating the voltage between the signal and common lines 32, 33 via the signal generator 31.

Figure 21:
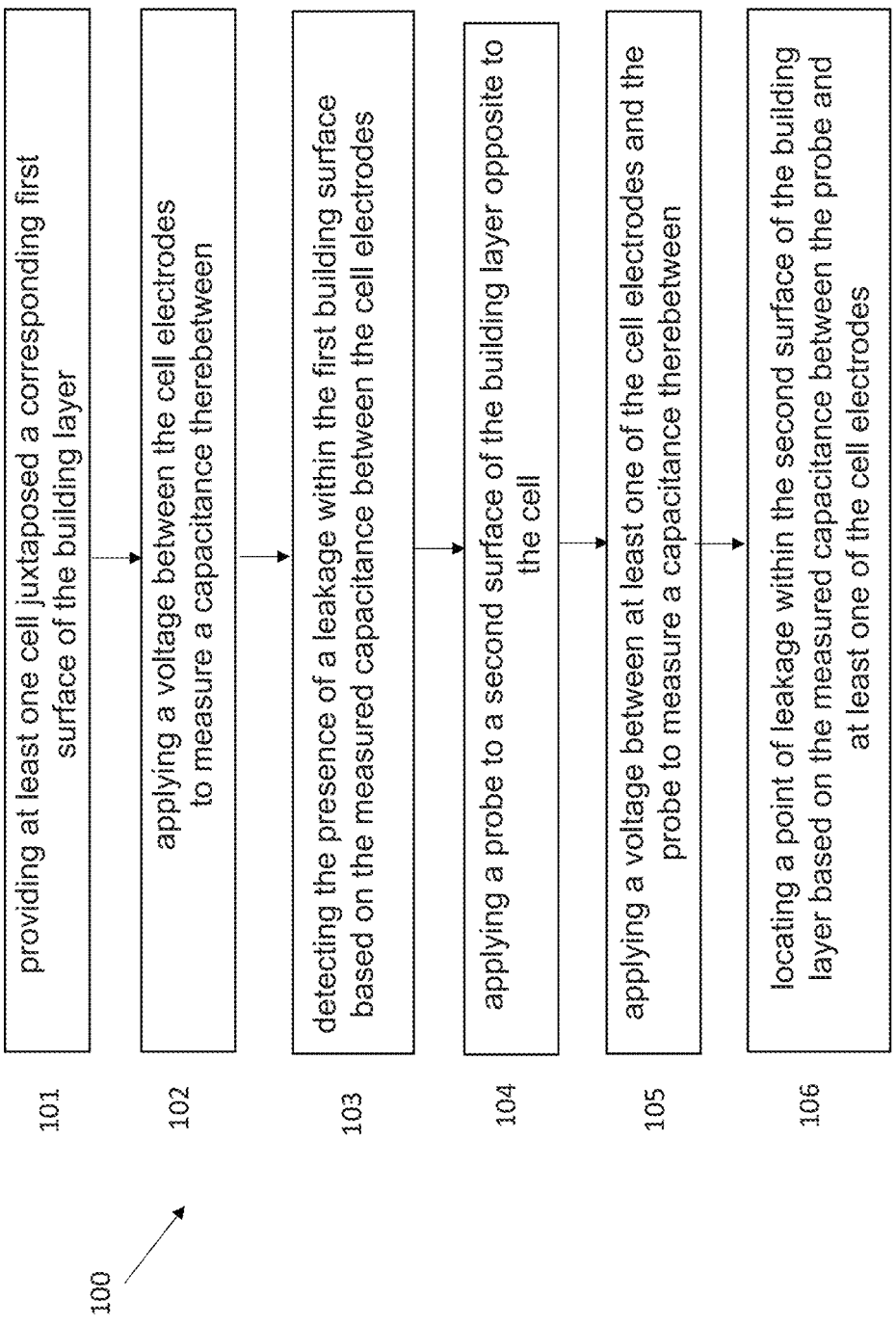
FIG. 21 illustrates a method according to an embodiment of the present invention.

As disclosed above, the voltage generated between the signal and common lines 32, 33 is then applied sequentially to the electrodes 10, 11 of the four cells 10 through the multiplexer 36 (method step 102 illustrated in FIG. 21). The flip-flop circuit 34 periodically swaps the polarity of this voltage.

In this way, the ACC 150 can read sequentially the outputs from the ADC 40 corresponding to the analogue voltage signals 38 measured between the electrodes 11, 12 of the four cells 10.

The capacitance measurements from the sensing modules 2 are sequentially acquired by the ACC 150 at a fixed time interval. A high acquisition rate is used, to collect continuous measurement as opposed to periodic measurements, thus increasing the detectability of a leak.

The acquired measurements are converted by the ACC 150 from a voltage which represents the capacitance between the cell electrodes 11, 12 to a percentage of saturation. This indicates the extent to which the cells 10 are saturated with fluid and if they are 'wet' or 'dry'.

Thus, the ACC 150 is capable of detecting both the presence of a fluid between the electrodes 11, 12 of a cell 10, as well as the fluid quantity based on a percentage saturation.

Once a threshold value has been reached representing the presence of fluid bridging the gap between the electrodes 11, 12, a presence of a leak is detected within the building surface 51 covered by the cell 10 (method step 103 illustrated in FIG. 21).

Once the presence of leak has been detected within a specific area of the building layer 50, the measurement values, sensor circuitry identifier (address) and time are recorded and stored by the ACC 150.

Furthermore, the ACC 150 can generate an alarm, to give an instant alert, and report the leak detection locally (e.g. through a local user interface (UI), such as a LCD screen) and/or remotely.

Figure 16:
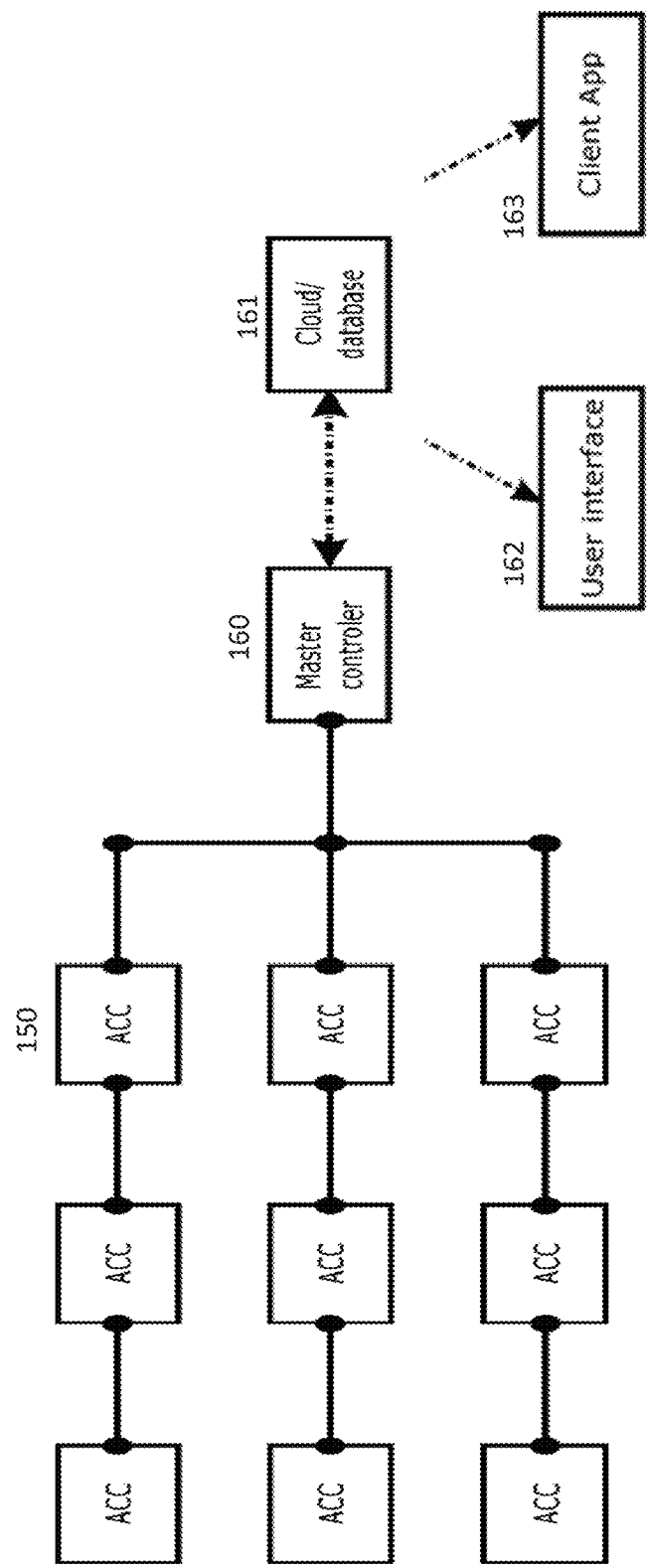
FIG. 16 illustrates a connection between a plurality of array control circuits and a master controller in the system according to an embodiment of the present invention.

With reference to FIG. 16, the system 1 can comprise a Master Controller (MC) 160 for monitoring multiple ACCs 150 and put them in communication with a front-end of the system 1.

When a leak is detected by one ACC 150, the ACC 150 forwards its data to the MC 160. The MC 160 transfers the information to the cloud 161 or a localized data storage. The information can then by notified to a front-end UI 162 and/or a client application 163. The UI 162 and the client application 163 are responsible for transferring the data taken from the MC 160 into a readable and easily understood format, for simple localization of the building area affected by leak and a faster response. The remote communication between the MC 160 and the cloud 161 can be realized using Bluetooth, LoRa, 3G etc.

The MC 160 can push an alert notification to operators, for further assistance in leak localization and repair.

Furthermore, the front-end of the system 1 can be responsible for providing means to control and supply firmware updates to the MC 160 and the ACCs 150.

Alternatively to the exemplary embodiment illustrated in FIG. 16, the system 1 can be stand-alone, thus not requiring any further computers or peripherals to operate than the ACCs 150 connected to local UIs.

When a presence of a leak is detected within a building surface 51, the system 1 is capable to operate according to a leak localization mode for locating a leak ingress point 155 within the opposite building surface 52.

In order to operate in leak localization mode, the sensor circuitry 20 of each sensing module 2 is further cooperable with a probe 70 arranged to be applied to the building surface 52.

Figure 11:
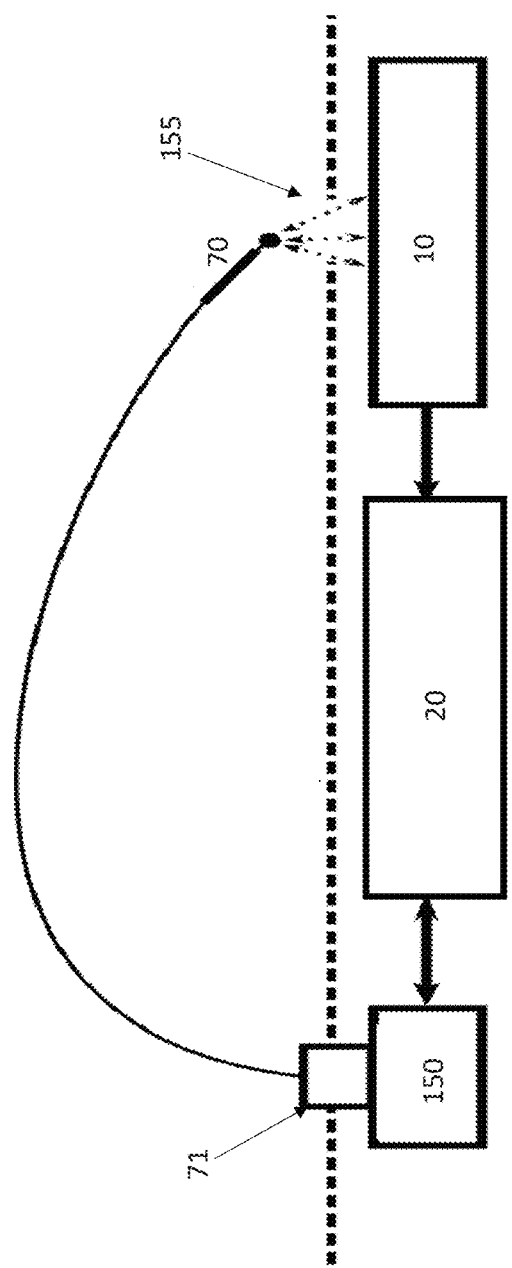
FIG. 11 illustrates a probe operatively connected to the array control circuit illustrated in FIG. 7.

For example, as illustrated in FIG. 11, the probe 70 can be connected to an electrical port 71 of the ACC 150 associated to the sensing module 2. In this way, the probe 70 is electrically connected, through the ACC 150, with the sensing circuit 20 of the module where the leak was detector and an operator of the probe 70 can easily access the building surface 52.

Figure 12:
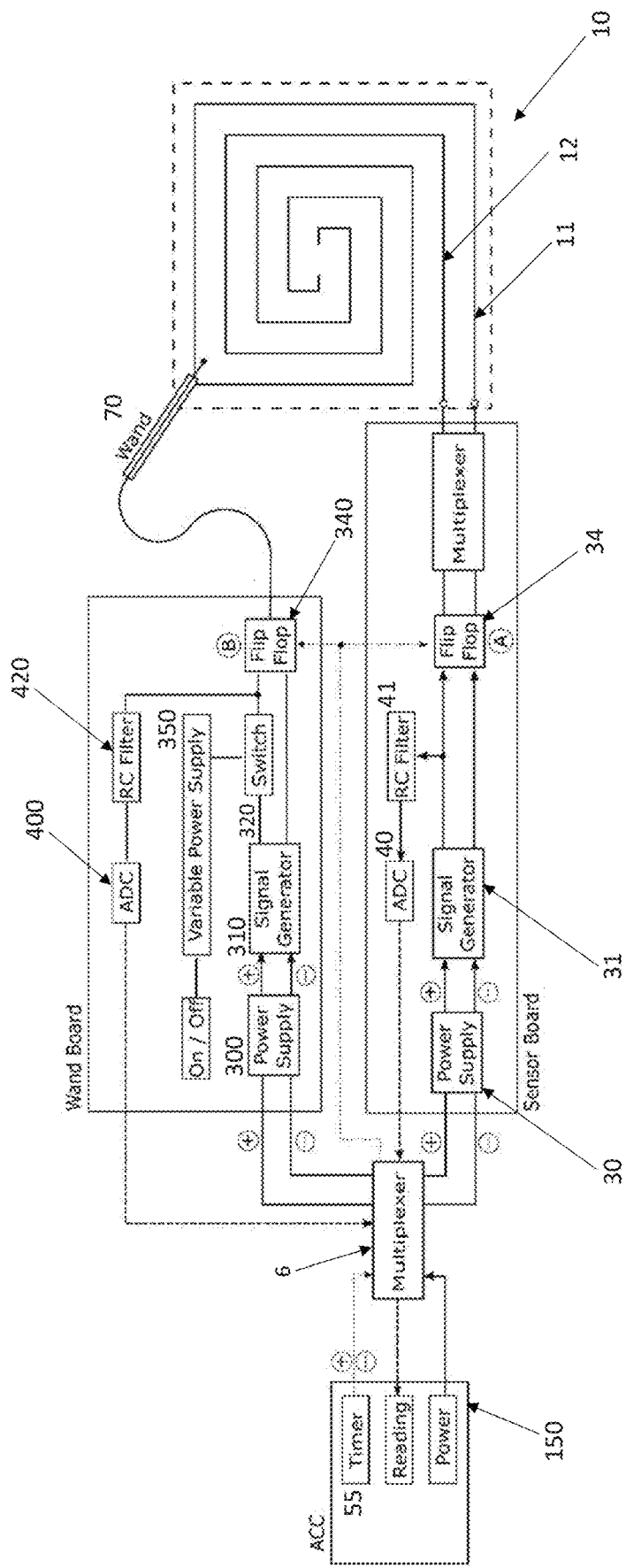
FIG. 12 illustrates the sensing module of FIG. 7, showing the circuitry for detecting the location of a leak ingress point.
Figure 13:
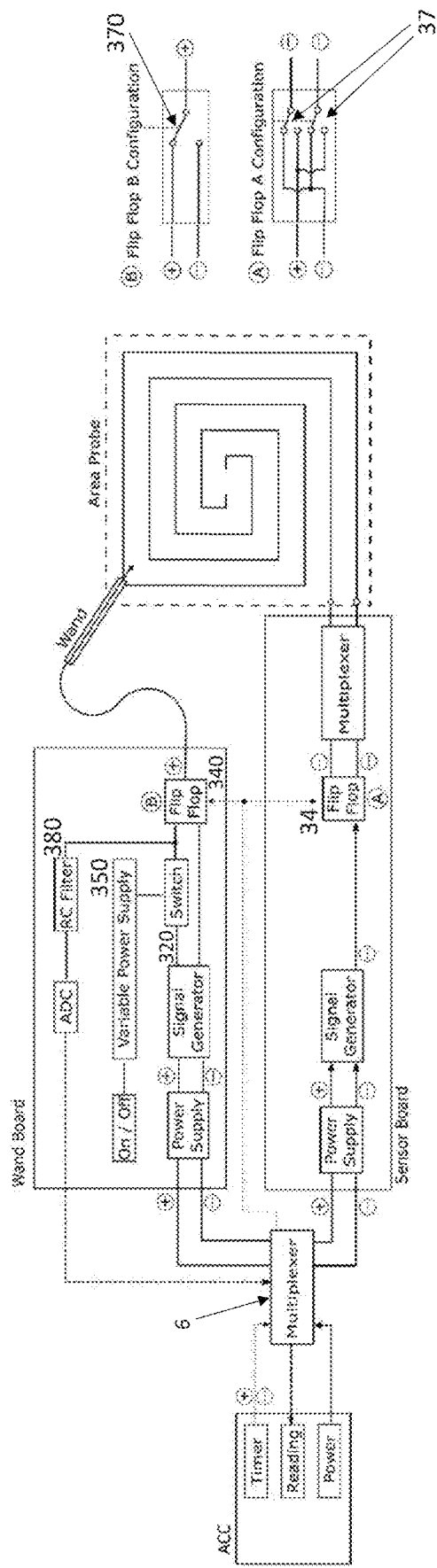
FIGS. 13 and 14 illustrate an operation of the sensing module of FIG. 12 for locating the leak ingress point, wherein the timer provides a positive signal in FIG. 13 and a negative signal in FIG. 14.
Figure 14:
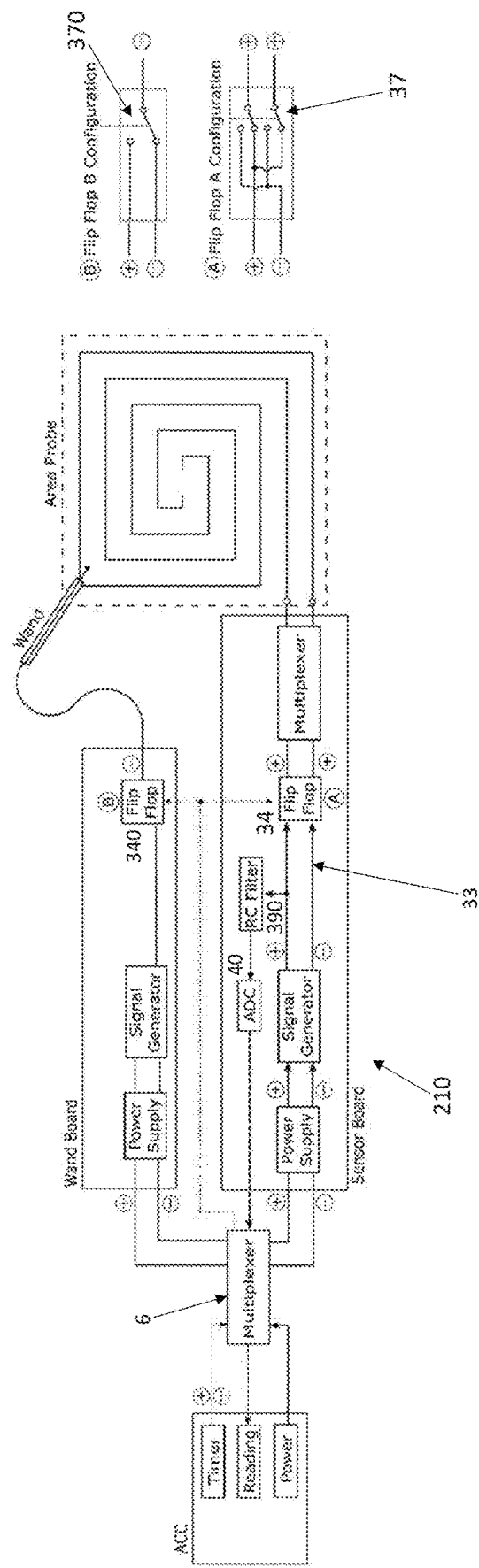

FIGS. 12-14 illustrate an embodiment of the sensing circuit 20 in a situation where a leak occurred at and has been detected by means of one cell 10, and an operator is applying the probe 70 to the building surface 52 opposite the cell 10 (method step 104 illustrated in FIG. 21).

The sensing circuitry 20 is configured to apply a voltage between the probe 70 and the electrodes 11, 12 (method step 105 illustrated in FIG. 21).

In particular, the flip-flop circuit 34 is configured to apply a same voltage to the electrodes 11, 12, and to be controlled by the timer 55 to swap periodically the polarity of this voltage as before.

FIG. 13 illustrates how a negative signal from the timer 55 controls the contacts 37 of the flip-flop circuit 34 to connect the electrodes 11 and 12 to the common line 33, while FIG. 14 illustrates how a positive timer signal controls the contacts 37 to change position and connect the electrodes 11 and 12 to the live line 32.

Alternatively, the flip-flop circuit 34 can be configured to disconnect one of the electrodes 11, 12 from both the live and common lines 32, 33, and to switch periodically the connection of the other electrode between the signal and common lines 32, 33 according to the frequency of the timer signal.

The sensing circuitry 20 further comprises a signal generator 310 connected to a power supply 300. The signal generator 310 is configured to be activated by the ACC 150 so as to generate a voltage for a live line 320 (having the same polarity of the live line 32).

The sensing circuitry 20 further comprises a flip-flop circuit 340 controllable by the timer 55 to periodically swap a connection of the probe 70 between the live line 320 and the common line 33. FIG. 13 illustrates how a positive timer signal controls the contact 370 of the flip-flop circuit 340 to connect the probe 70 with the live line 320, while FIG. 14 illustrates how a negative timer signal controls the contact 370 to change position and connect the probe 70 to the common line 33.

Figure 15:
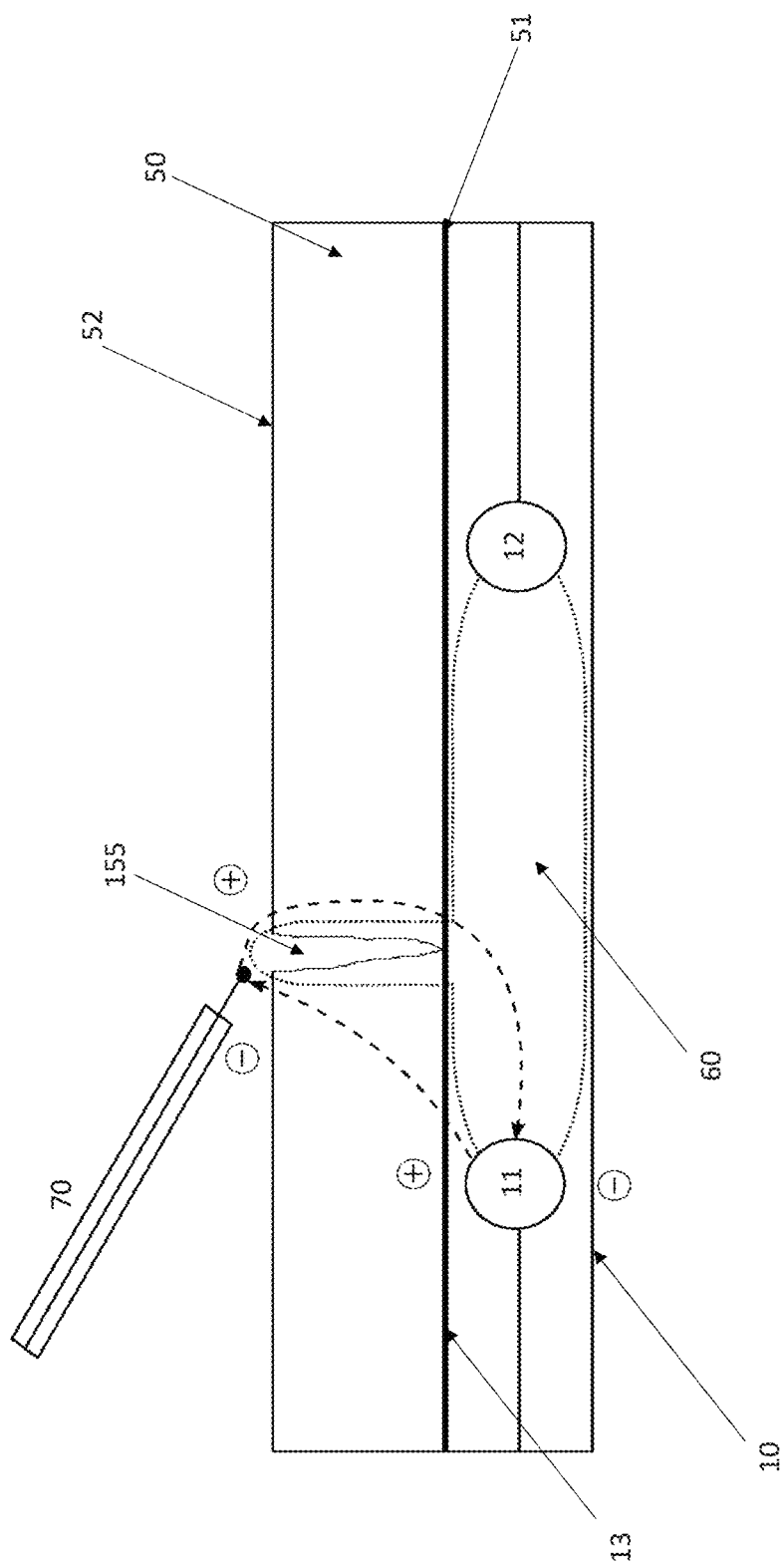
FIG. 15 illustrates a sensing zone of the cell under interaction with the probe for locating the leak ingress point.

Thus, the timer 55 synchronizes the operations of the flip-flop circuits 34 and 340 so as to periodically swap the polarity of the voltage applied between the probe 70 and the electrodes 11, 12, as illustrated for example in FIG. 15.

In this way, interference effects between the probe 70 and the environment are mitigated, since the connection of the probe 70 with the live line 340 is alternated with the connection with the common line 33.

With reference to FIG. 12-13, the sensing circuitry 20 further comprises variable power supply circuitry 350 configured to boost the voltage level of the live line 340, e.g. to 5 V.

In order to operate a capacitance sensing between the probe 70 and the electrodes 11, 12, the signal generators 31 and 310 are configured to pulse the voltage of the live lines 32 and 320 at a radio frequency range, e.g. between 30 kHz and 1 MHz.

With reference to FIG. 13, when the probe 70 is connected to the pulsed live line 320, an analogue voltage signal 380 between the probe 70 and the electrodes 11, 12 can be provided to an RC filter 410. The voltage signal 380 is indicative of the capacitance value between the probe 70 and the electrodes 11, 12. The filtered signal 380 is then applied to an ADC 400, and the output of the ADC 400 can be read by the ACC 150.

With reference to FIG. 14, when the probe 70 is connected to the common line 33, an analogue voltage signal 390 between the probe 70 and the electrodes 11, 12 can be provided to the RC filter 41. The voltage signal 390 is also indicative of the capacitance value between the probe 70 and the electrodes 11, 12. The filtered signal 390 is then applied to the ADC 40, and the output of the ADC 40 can be read by the ACC 150.

Alternatively to the embodiment illustrated in FIGS. 12-14, the sensing circuit 20 can be configured to apply a voltage between the probe 70 and the electrodes 11, 12 without swapping its polarity, wherein the probe 70 is kept connected to the common line 33 and the electrodes 11, 12 are kept connected to the live line 32.

In response to pulsing the live line 32, the voltage signal 390 indicative of the capacitance between the probe 70 and the electrodes 11, 12 can be applied to the ADC 40. Thus, in this configuration the sensing circuit 20 advantageously requires only one ADC 40 for measuring the capacitance between the probe 70 and the electrodes 11, 12.

With now reference to FIG. 15, the leak ingress point 155 acts to alter the electrical properties between the electrodes 11, 12 and the building surface 52 under monitoring through the probe 70. Hence, more the probe 70 comes closer to the leak ingress point 155 and more the capacitance between the probe 70 and the electrodes 11, 12 increases.

This corresponds to an increasing of the voltage between the probe 70 and the electrodes 11, 12. The voltage increasing would continue until the probe 70 has reached the leak point 155, where any deviation from this point 155 will result in a voltage reduction.

Applying the same voltage to the electrodes 11, 12 through the flip-flop circuit 34 means significantly increasing the precision to locate leak point 155, as the maximum possible distance the probe 70 can be from the electrodes 11, 12 connected to the live line 32 is halved.

Based on the above, the ACC 150 can detect the location of the leak ingress point 55 within the monitored building surface 52 based on the outputs provided by the ADCs 40, 400, which correspond to the measured voltages signals 380 and 390 (method step 106 illustrated in FIG. 21).

The resolution of detecting the leak position within the monitored building surface 52 (having an area in the order of m$^2$) is in the order to few mm$^2$.

The ACC 150 can store the measurements acquired using the probe 70 and report the detected location of the leak ingress point 155 locally and/or remotely via the MC 160.

Once the leak ingress point 155 has been precisely located using the probe 70, the system 1 can return to operate on the sensing module 2 for measuring the capacitance between the electrodes 11, 12 of the cell 10.

In this way, the ACC 150 can determine if the leak has been successfully fixed after a construction or repair intervention. Indeed, a proper repair will waterproof the building layer 50, creating a barrier that stops fluid reaching the fabric of the cell 10. As the fabric dries, the capacitance between the electrodes 11, 12 will decrease and the ACC 150 can detect this using the capacitance measurements provided by the ADC 40.

The ACC 150 can store and report the detected ceasing of the leak locally and/or remotely via the MC 160.

In addition to detecting and recording the occurrence and ceasing of the leak in a cell 10, the system 1 can be configured to perform data-logging to track the progression over time of the leak in the cell 10 where it started as well as into the neighbouring cells 10.

Figure 17:
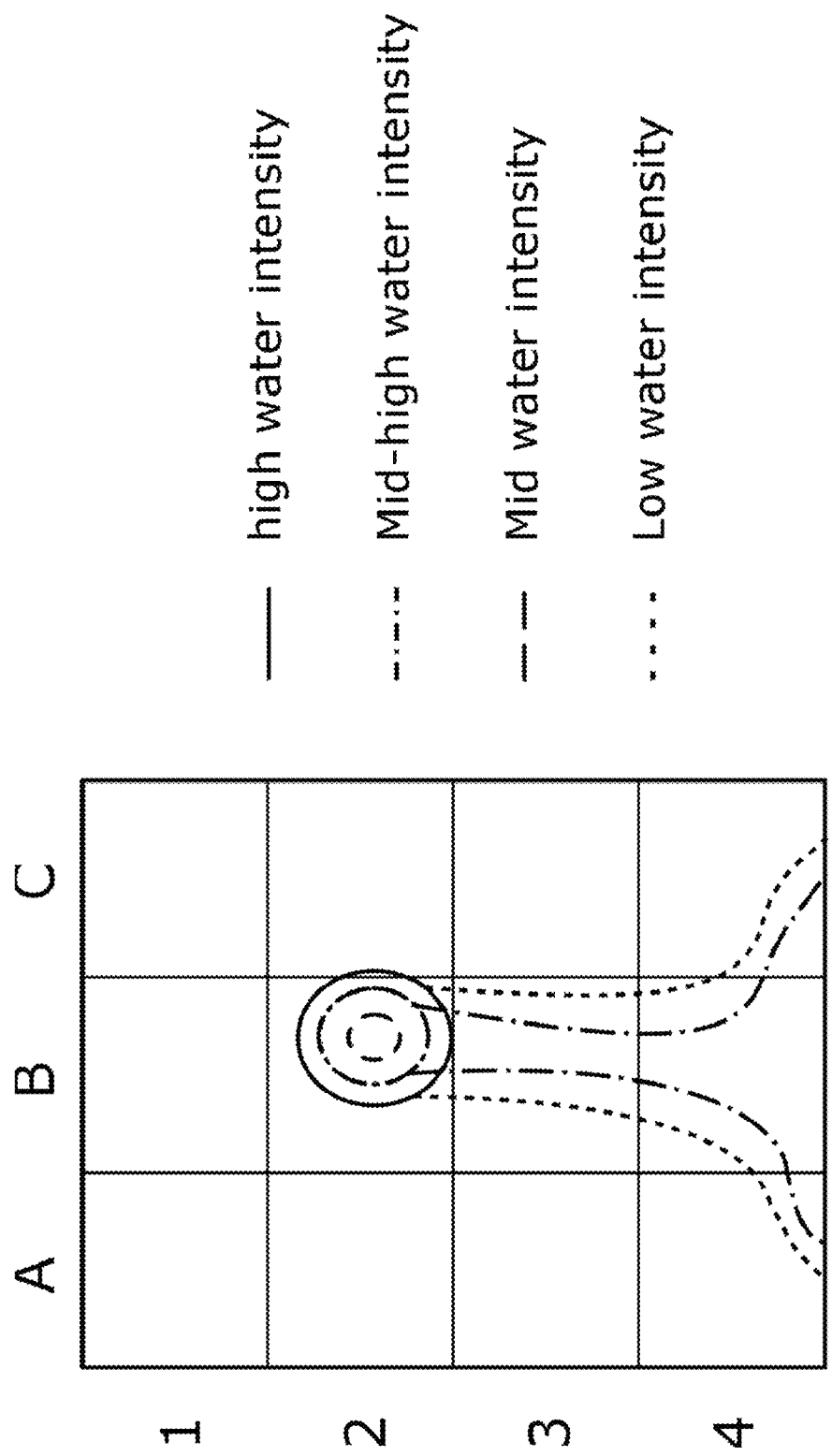
FIG. 17 illustrates a leak source and progression at different system cells.

An exemplary propagation of a large leak is illustrated in FIG. 17, where each of the illustrated quadrants correspond to a cell 10 of the system 1. The leak starts at quadrant B2 and progresses downwards through quadrants B3 to B4. The water then pools at the lower sections and spreads to quadrants A4 and C4. The proximity of the leak source to quadrant C3 results in a small amount of fluid water to be present into C3.

If data logging was not used, and only leak occurrence and location detection was performed for the cells 10, information on the leak severity, progression, number of ingress points, as well as the location where the leak started would be missed.

A first data logging embodiment is described with reference to FIG. 18. According to this embodiment, for each cell 10 the system 1 is configured to:
trigger the generation of a digital signal 500, when the ACC 150 detects the leak presence at the cell 10; and
stop the digital signal 500 when the ACC 150 detects the leak ceasing.

Figure 18:
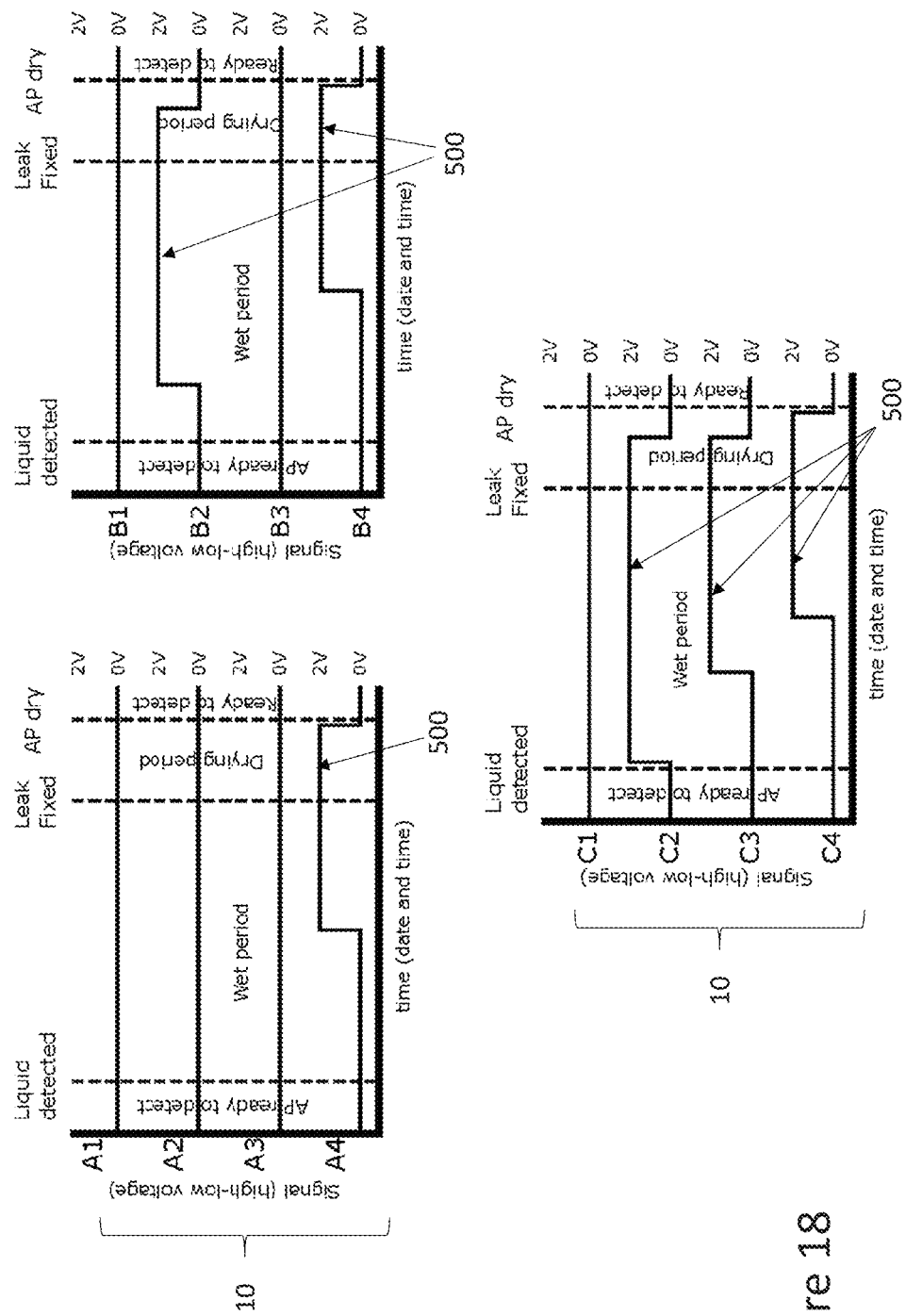
FIG. 18 illustrates digital leak data logging signals associated with different system cells.

FIG. 18 illustrates such data logging procedure applied to the leak propagation illustrated in FIG. 17. From the information provided by the data logging signals 500 it can be derived that the leak started initially at quadrant B2, followed by quadrant C2. It can be further derived that the fluid progressed from B2 to quadrant B4 and pooled, spreading to quadrants A4 and C4. The data logging signals 500 also provide information about when the leak has been fixed in the quadrants.

This data logging is easily readable, simple and cheap to be programmed and implemented, and require low power to operate.

Figure 19:
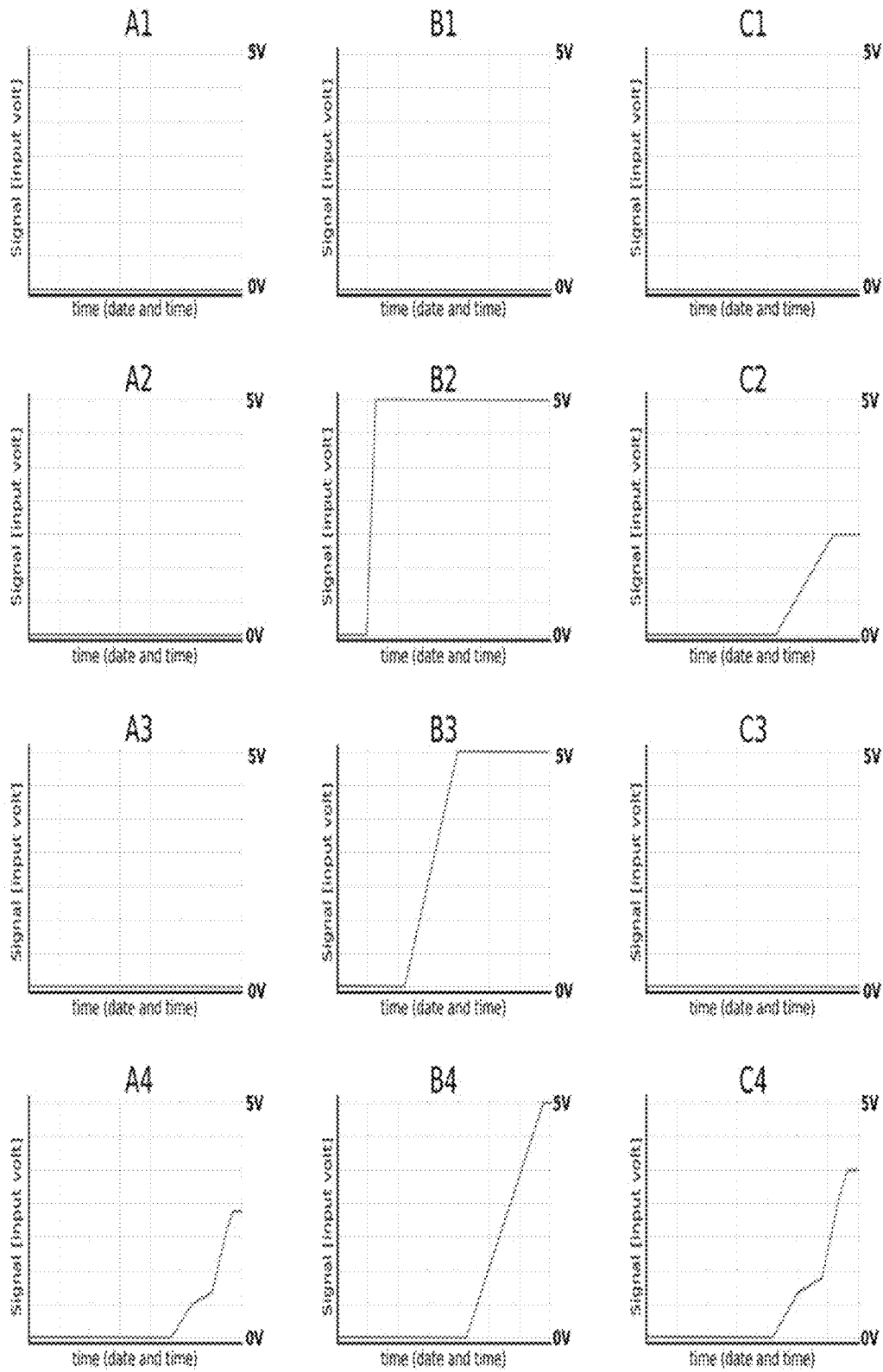
FIG. 19 illustrates leak data logging signals corresponding to capacitance measurements of different system cells.
Figure 20:
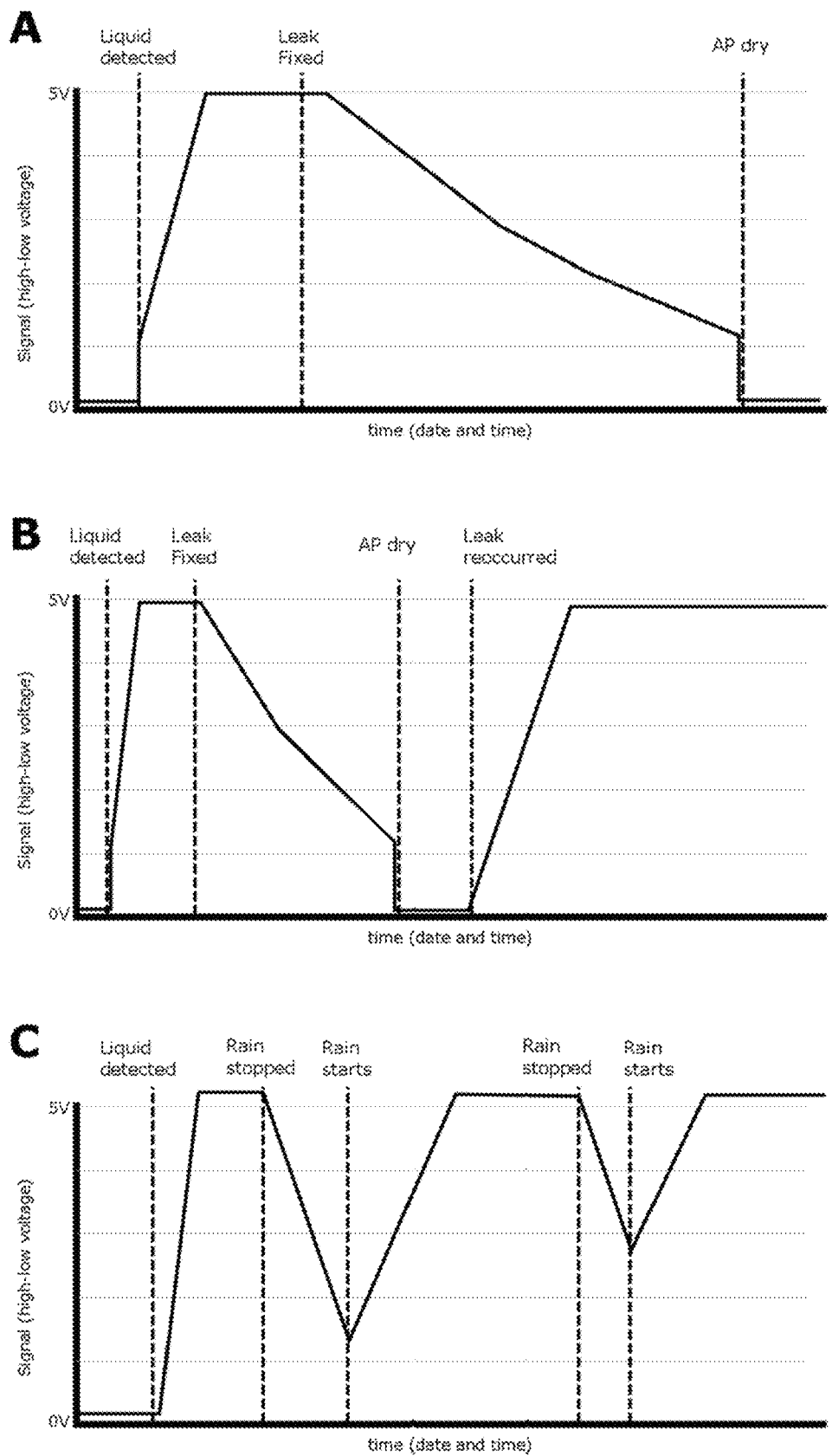
FIG. 20 illustrates leak data logging signals corresponding, respectively, to situations where a roof has been successfully fixed, the roof has not been successfully fixed, and where the leaks were caused by weather conditions and have been untreated.

A second data logging embodiment is described with reference to FIGS. 19-20. According to this embodiment, after the ACC 150 detects a leak presence within a cell 10, the ACC 150 continues to collect measurements of the capacitance between the electrodes 11, 12 and triggers the system to record such further measurements over the time, until a leak ceasing is detected. For example, the ACC 150 can generate a high pulse and a low pulse to trigger the start and stop, respectively, of the measurements recording.

This data logging produces detailed and precise recording of the leak propagation. For example, FIG. 18 illustrates such a data logging procedure applied to the leak propagation illustrated in FIG. 17. From the information provided by the recorded cell capacitance measurements over time, it can be derived that the leak originated someplace within quadrant B2. It can also be derived that this leak is somewhat significant, as it rapidly reaches the maximum saturation value. As the leak travels from quadrant B2 to B4, the slope of the measured signal decreases, thus indicating a reduction in fluid quantity. This would suggest that the leak origin is only in quadrant B2. A small voltage level detected in quadrant C2 suggests that a small amount of fluid is also passing from B2 into C2.

With this data-logging setup, it is relatively simple to determine where a leak or even multiple leaks originated from, and to what extent they are spreading among the cells 10.

Using this setup, it is also possible to determine if the cells 10 are drying out after the leak has been fixed. For example, FIG. 20 shows three different scenarios:
A. The successful repairing of the building layer 50;
B. The unsuccessful repairing of the building layer 50;
C. The effects of weather on the building layer 50.

In scenario A, it can be seen that after the building layer 50 has been repaired there is a period of drying before the voltage begins to slowly drop. This drop is fairly constant until it reaches the minimum voltage threshold, where there is a low signal, stopping the measurements recording. In this case it is found that the repair was a success. If this signal was to be overlain with data of rainfall, then it could be conclusively show that if rain occurred without incident then the repair was successful.

Scenario B shows a case of an unsuccessful repair, where an incidence of rain resulted in a rewetting of the sensor after the cell 10 was fully dried out.

Scenario C shows a situation where a leak is not fixed, and is just left. In this situation, each time it rains more water reaches the cell 10. If this trend does not correlate to rainfall, then it could be taken that the leak is either when the rain is very heavy or it could be a problem with an internal leaking, such as an internal pipe leaking.

Figure 22:
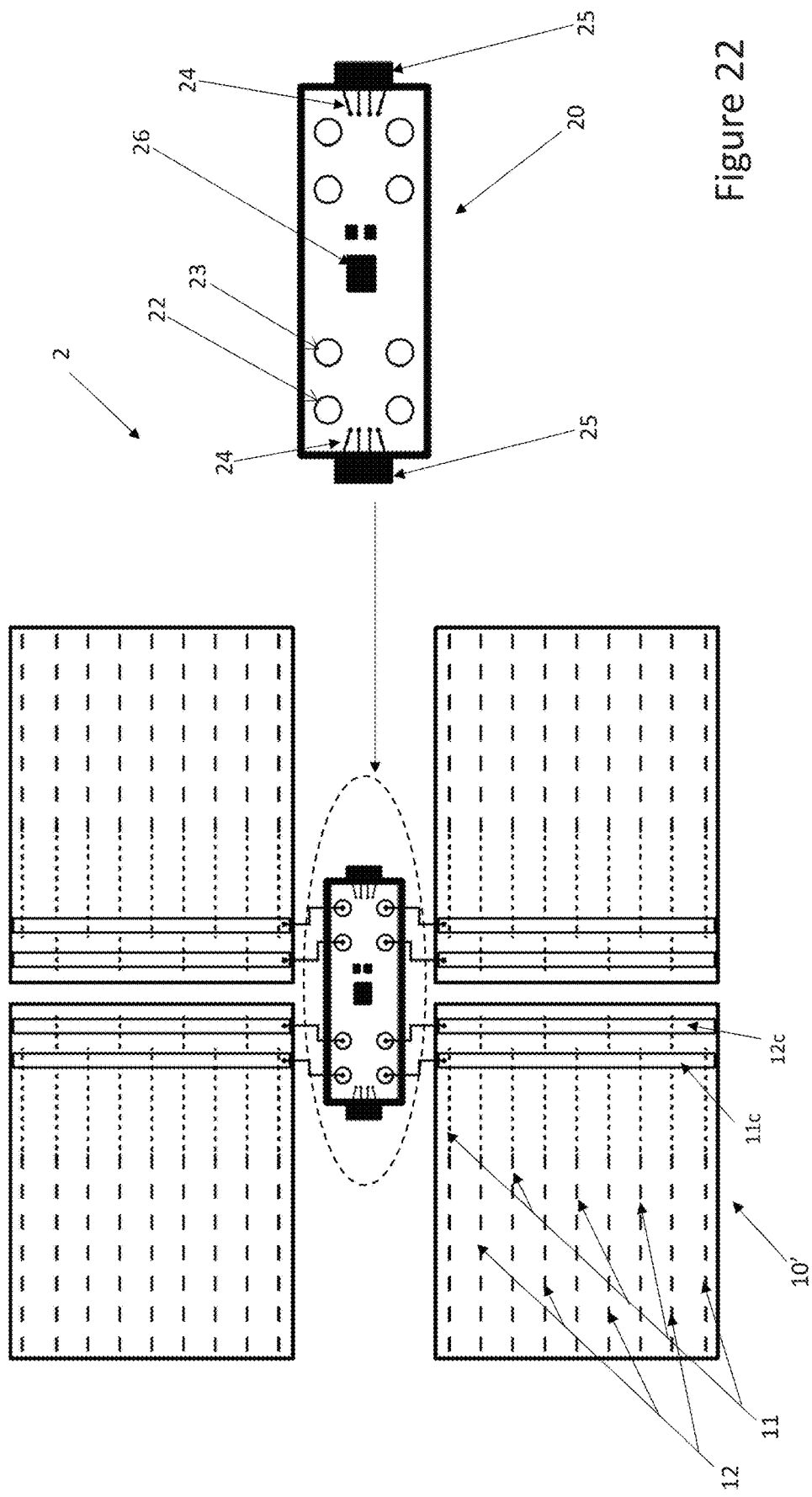
FIG. 22 illustrates an alternative electrode arrangement for a cell.

Referring now to FIG. 22, there is shown an alternative layout for the electrodes 11 and 12 within a cell 10'. As will be seen, rather than a continuous pair of electrodes defining respective spiral paths as in the previous embodiments, the electrodes comprise a number of straight strips laid out in an alternating pattern with each electrode extending across a major surface of the cell 10'. The set of electrodes 11 are inter-connected with a transverse strip 11c, while the set of electrodes 12 are inter-connected with a separate transverse strip 12c. Each strip 11c, 12c connects back to the sensor board 20 and operates as before. Nonetheless, if it will be seen that in this case, it is easier to provide the cells 10' in any length; or with suitable re-calibration to reduce the width of a cell, by cutting away pairs of electrodes 11, 12 remote from the sensor board connector, if it needs to fit into a non-standard space.

It will be appreciated that for embodiments based on measuring capacitance as the electrical property between electrodes, there is the possibility of detecting the presence of a fluid between the electrodes, without a physical connection by the fluid between the electrodes being made. This gives the system the ability to detect the presence of small amounts of fluid at a very early stage, prior to a physical connection of the fluid to an electrode. This value will be somewhat less than if the fluid is in contact with a positive electrode, and less again than if the fluid is in contact with both a positive and negative electrode. As a result, it may not always be clear that the fluid is directly connecting one or two electrodes, or if the fluid quantity is increasing initially as it travels between the electrodes.

As such, having sensing that can be configured to detect direct connections of fluid between the electrodes using AC resistance (impedance) or DC resistance methods that the sensor can switch between would allow the system to determine when a physical bridge between the electrodes has occurred.

This system would also allow for a double confirmation process. Thus, if a large change of capacitance is seen to occur (saturation of a significant portion of the fabric)

without a bridging of the electrodes, then it could be seen that something is interfering with the reading and there may not be a fluid present. If the previous case is seen to happen and a direct connection is found to occur then it could be shown that there is a definite presence of fluid.

This system can also be adopted for use with the probe, to give an extra layer of confirmation of a direct bridge at the point of ingress and as to fix being achieved.

The invention claimed is:

1. A system for detecting and locating a leak in a building layer, the system comprising:
    at least one sensing module comprising:
        at least one cell having a major surface juxtaposed to a portion of a first surface of the building layer and incorporating at least one pair of mutually spaced electrodes defining a sensing path extending parallel to the cell major surface; and
        sensing circuitry cooperable with said cell and configured to apply a voltage between the cell electrodes to measure an electrical property therebetween, said sensing circuitry being further cooperable with a probe arranged to be applied to a second surface of the building layer opposite said first surface and being further configured to apply a voltage between at least one of the cell electrodes and the probe to measure an electrical property therebetween; and
    control circuitry operatively associated with said sensing circuitry and configured to:
        detect the presence of a leak within the portion of the first surface based on at least a first measurement from the sensing circuitry of the electrical property between the cell electrodes; and
        locate a point of leakage within the portion of the first surface based on at least a second measurement from the sensing circuitry of the electrical property between the probe and at least one of the cell electrodes.

2. The system of claim 1, wherein said sensing circuitry is configured to swap a polarity of the voltage applied between the cell electrodes to measure the electrical property therebetween.

3. The system of claim 1, wherein the sensing circuitry comprises first analog-to-digital converting circuitry configured to measure an analog signal present between the cell electrodes when said voltage is applied between the cell electrodes.

4. The system of claim 3, wherein said first analog-to-digital converting circuitry is configured to measure an analogue signal between the probe and at least one of the cell electrodes , when the probe is connected to a common line of the system.

5. The system of claim 3, wherein said sensing circuity comprises second analog-to-digital converting circuitry configured to measure an analogue signal between the probe and at least one of the cell electrodes, when the probe is connected to a positive supply line of the system.

6. The system of claim 5, wherein said sensing circuitry comprises variable power supply circuitry configured to boost a level of the positive supply line.

7. The system of claim 1, wherein the sensing circuitry is configured to swap a polarity of the voltage applied between the probe and at least one the cell electrodes.

8. The system of claim 1, wherein the sensing circuitry is configured to apply the same voltage to the cell electrodes in order to measure the electrical property between the probe and the cell electrodes.

9. The system of claim 1, wherein said at least one cell comprises a group of cells, and said sensing circuitry comprises first selecting circuitry configured and controllable to sequentially select the cells for applying said voltage and measuring the electrical property between the cell electrodes.

10. The system of claim 1, wherein said cell comprises a plurality of sub-cells, each sub-cell including mutually spaced electrodes defining a sensing sub-path extending parallel to a major surface of the sub-cell, and wherein the sensing sub-paths are connected to each other to define a cell path.

11. The system of claim 1, wherein said measured electrical property between the cell electrodes is a capacitance and the sensing circuitry is configured to pulse the voltage applied between the cell electrodes.

12. The system of claim 1, wherein said measured electrical property between the probe and at least one of the cell electrodes is a capacitance and the sensing circuitry is configured to pulse the voltage applied between the probe and at least one of the cell electrodes.

13. The system of claim 1, wherein said control circuitry comprises at least one sensor array control circuit and said at least one sensing module comprises an array of sensing modules operatively connected to the at least one sensor array control circuit.

14. The system of claim 1, wherein the system is configured to generate and log data indicative of a progression of a detected leak over time.

15. A method for detecting and locating the leak in the building layer, comprising:
    providing a system as claimed in claim 1 wherein at least one cell is provided so as the major surface of the cell is juxtaposed to the portion of the first surface of the building layer, the cell incorporating said at least one pair of mutually spaced electrodes defining the sensing path extending parallel to the cell major surface; and
    applying the voltage between the cell electrodes to measure the electrical property therebetween;
    detecting the presence of the leak within the portion of said first surface of the building layer based on the at least a first measurement of the electrical property between the cell electrodes;
    upon detecting the presence of a the leak:
    applying the probe to the second surface of the building layer opposite said first surface;
    applying the voltage between at least one of the cell electrodes and the probe to measure the electrical property therebetween; and
    locating a point of leakage within the portion of the first surface based on the at least a second measurement of the electrical property between the probe and the at least one of the cell electrodes.

* * * * *